(12) United States Patent
Yamazaki

(10) Patent No.: US 9,583,632 B2
(45) Date of Patent: Feb. 28, 2017

(54) OXIDE SEMICONDUCTOR FILM, METHOD FOR FORMING OXIDE SEMICONDUCTOR FILM, AND SEMICONDUCTOR DEVICE

(71) Applicant: Semiconductor Energy Laboratory Co., Ltd., Atsugi-shi, Kanagawa-ken (JP)

(72) Inventor: Shunpei Yamazaki, Setagaya (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 14/278,157

(22) Filed: May 15, 2014

(65) Prior Publication Data
US 2015/0021593 A1 Jan. 22, 2015

(30) Foreign Application Priority Data

Jul. 19, 2013 (JP) ................................. 2013-150979

(51) Int. Cl.
*H01L 29/786* (2006.01)
*H01L 29/66* (2006.01)

(52) U.S. Cl.
CPC .... *H01L 29/7869* (2013.01); *H01L 29/66969* (2013.01)

(58) Field of Classification Search
CPC .................................................. H01L 29/7869
USPC .......................................... 257/43; 438/104
See application file for complete search history.

(56) References Cited

U.S. PATENT DOCUMENTS

| | | |
|---|---|---|
| 5,731,856 A | 3/1998 | Kim et al. |
| 5,744,864 A | 4/1998 | Cillessen et al. |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |

(Continued)

FOREIGN PATENT DOCUMENTS

| | | |
|---|---|---|
| EP | 1737044 A | 12/2006 |
| EP | 2226847 A | 9/2010 |

(Continued)

OTHER PUBLICATIONS

Asakuma.N. et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

(Continued)

*Primary Examiner* — Fernando L Toledo
*Assistant Examiner* — Neil Prasad
(74) *Attorney, Agent, or Firm* — Eric J. Robinson; Robinson Intellectual Property Law Office, P.C.

(57) ABSTRACT

A crystalline oxide semiconductor film and a semiconductor device including the oxide semiconductor film are provided. One embodiment of the present invention is an oxide semiconductor film including a plurality of flat-plate particles each having a structure in which layers including a gallium atom, a zinc atom, and an oxygen atom are provided over and under a layer including an indium atom and an oxygen atom. In the semiconductor film, the plurality of flat-plate particles face in random directions, and a crystal boundary is not observed using a transmission electron microscope.

19 Claims, 19 Drawing Sheets

(56) References Cited

U.S. PATENT DOCUMENTS

| | | |
|---|---|---|
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,601,984 B2 | 10/2009 | Sano et al. |
| 7,674,650 B2 | 3/2010 | Akimoto et al. |
| 7,732,819 B2 | 6/2010 | Akimoto et al. |
| 7,791,072 B2 | 9/2010 | Kumomi et al. |
| 7,935,964 B2 | 5/2011 | Kim et al. |
| 7,998,372 B2 | 8/2011 | Yano et al. |
| 8,168,544 B2 | 5/2012 | Chang |
| 8,207,756 B2 | 6/2012 | Shionoiri et al. |
| 8,236,635 B2 | 8/2012 | Suzawa et al. |
| 8,242,494 B2 | 8/2012 | Suzawa et al. |
| 8,304,765 B2 | 11/2012 | Yamazaki et al. |
| 8,309,961 B2 | 11/2012 | Yamazaki et al. |
| 8,319,215 B2 | 11/2012 | Yamazaki et al. |
| 8,343,799 B2 | 1/2013 | Ito et al. |
| 8,748,886 B2 | 6/2014 | Yamazaki et al. |
| 9,287,352 B2 | 3/2016 | Yamazaki |
| 2001/0046027 A1 | 11/2001 | Tai et al. |
| 2002/0000593 A1 | 1/2002 | Nishiyama et al. |
| 2002/0028541 A1 | 3/2002 | Lee et al. |
| 2002/0056838 A1 | 5/2002 | Ogawa |
| 2002/0132454 A1 | 9/2002 | Ohtsu et al. |
| 2003/0006373 A1 | 1/2003 | Koguchi et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0067659 A1 | 4/2004 | Black et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0154561 A1 | 7/2007 | Takeda et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1* | 8/2007 | Hosono et al. ............... 257/347 |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0008908 A1 | 1/2008 | Ishiwata et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0099803 A1 | 5/2008 | Li et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0180544 A1 | 7/2008 | Drader et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0008638 A1 | 1/2009 | Kang et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0179199 A1 | 7/2009 | Sano et al. |
| 2009/0278122 A1 | 11/2009 | Hosono et al. |
| 2009/0280600 A1 | 11/2009 | Hosono et al. |
| 2010/0051938 A1* | 3/2010 | Hayashi et al. ............... 257/43 |
| 2010/0051949 A1 | 3/2010 | Yamazaki et al. |
| 2010/0065839 A1 | 3/2010 | Yamazaki et al. |
| 2010/0065840 A1 | 3/2010 | Yamazaki et al. |
| 2010/0065844 A1 | 3/2010 | Tokunaga |
| 2010/0072467 A1 | 3/2010 | Yamazaki et al. |
| 2010/0084650 A1 | 4/2010 | Yamazaki et al. |
| 2010/0092800 A1 | 4/2010 | Itagaki et al. |
| 2010/0102312 A1 | 4/2010 | Yamazaki et al. |
| 2010/0105163 A1 | 4/2010 | Ito et al. |
| 2010/0108502 A1* | 5/2010 | Inoue ..................... C04B 35/01 204/298.13 |
| 2010/0109002 A1 | 5/2010 | Itagaki et al. |
| 2010/0117075 A1 | 5/2010 | Akimoto et al. |
| 2010/0123136 A1 | 5/2010 | Lee et al. |
| 2010/0193782 A1 | 8/2010 | Sakata |
| 2010/0301329 A1 | 12/2010 | Asano et al. |
| 2011/0062433 A1 | 3/2011 | Yamazaki |
| 2011/0062436 A1 | 3/2011 | Yamazaki et al. |
| 2011/0117698 A1 | 5/2011 | Suzawa et al. |
| 2012/0037901 A1* | 2/2012 | Mori et al. ............... 257/43 |
| 2012/0064703 A1 | 3/2012 | Jintyou et al. |
| 2012/0138922 A1 | 6/2012 | Yamazaki et al. |
| 2012/0184066 A1 | 7/2012 | Yano et al. |
| 2012/0211745 A1 | 8/2012 | Ueda et al. |
| 2012/0267624 A1 | 10/2012 | Isobe et al. |
| 2012/0276694 A1 | 11/2012 | Koezuka et al. |
| 2013/0009220 A1 | 1/2013 | Yamazaki et al. |
| 2013/0075723 A1 | 3/2013 | Yamazaki et al. |
| 2013/0082337 A1 | 4/2013 | Chudzik et al. |
| 2013/0087782 A1 | 4/2013 | Yamazaki et al. |
| 2013/0092924 A1 | 4/2013 | Sasagawa et al. |
| 2013/0092929 A1 | 4/2013 | Okazaki et al. |
| 2013/0099229 A1 | 4/2013 | Wakana et al. |
| 2013/0214273 A1 | 8/2013 | Yamazaki et al. |
| 2013/0221351 A1 | 8/2013 | Ebata et al. |
| 2013/0298989 A1* | 11/2013 | Tomizawa et al. ........... 136/258 |
| 2013/0341180 A1 | 12/2013 | Yamazaki |
| 2014/0001032 A1 | 1/2014 | Yamazaki |
| 2014/0021036 A1 | 1/2014 | Yamazaki |
| 2014/0042014 A1 | 2/2014 | Yamazaki |
| 2014/0045299 A1 | 2/2014 | Yamazaki |

(56) References Cited

U.S. PATENT DOCUMENTS

| | | | |
|---|---|---|---|
| 2014/0102877 A1* | 4/2014 | Yamazaki | C30B 23/005 204/192.15 |
| 2014/0103339 A1 | 4/2014 | Yamazaki et al. | |
| 2014/0124776 A1 | 5/2014 | Takahashi et al. | |
| 2014/0145183 A1 | 5/2014 | Yamazaki | |
| 2014/0151687 A1 | 6/2014 | Yamazaki | |
| 2014/0175435 A1 | 6/2014 | Yamazaki et al. | |
| 2014/0183527 A1 | 7/2014 | Yamazaki et al. | |
| 2014/0183530 A1 | 7/2014 | Yamazaki et al. | |
| 2014/0203276 A1 | 7/2014 | Yamazaki et al. | |
| 2014/0225104 A1 | 8/2014 | Yamazaki et al. | |
| 2014/0284596 A1 | 9/2014 | Yamazaki et al. | |
| 2014/0306219 A1 | 10/2014 | Yamazaki et al. | |
| 2014/0333864 A1 | 11/2014 | Miyake et al. | |
| 2014/0346500 A1 | 11/2014 | Yamazaki | |
| 2016/0149048 A1 | 5/2016 | Yamazaki | |

FOREIGN PATENT DOCUMENTS

| | | | |
|---|---|---|---|
| JP | 60-198861 A | 10/1985 | |
| JP | 63-210022 A | 8/1988 | |
| JP | 63-210023 A | 8/1988 | |
| JP | 63-210024 A | 8/1988 | |
| JP | 63-215519 A | 9/1988 | |
| JP | 63-239117 A | 10/1988 | |
| JP | 63-265818 A | 11/1988 | |
| JP | 05-251705 A | 9/1993 | |
| JP | 08-264794 A | 10/1996 | |
| JP | 11-505377 | 5/1999 | |
| JP | 2000-044236 A | 2/2000 | |
| JP | 2000-150900 A | 5/2000 | |
| JP | 2002-076356 A | 3/2002 | |
| JP | 2002-289859 A | 10/2002 | |
| JP | 2003-086000 A | 3/2003 | |
| JP | 2003-086808 A | 3/2003 | |
| JP | 2004-103957 A | 4/2004 | |
| JP | 2004-273614 A | 9/2004 | |
| JP | 2004-273732 A | 9/2004 | |
| JP | 2006-165528 A | 6/2006 | |
| JP | 2006-165529 A | 6/2006 | |
| JP | 2006-261483 A | 9/2006 | |
| JP | 2010-058135 A | 3/2010 | |
| JP | 2012-144431 A | 8/2012 | |
| WO | WO-2004/114391 | 12/2004 | |
| WO | WO 2007/058231 | 5/2007 | |

OTHER PUBLICATIONS

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using Castep", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl, Phys. Lett, (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZNO TFTS) for AMLCDs", Journal of the SID, 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12,1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kitzerow.H at al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits , 2008, vol. 43, No. 1, pp. 292-299.

(56) References Cited

OTHER PUBLICATIONS

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-0455014-4.
Lee.H et al., "Current Status of, Challenges to, and Perspective View of AM-OLED", IDW '06 : Proceedings of the 13th International Display Workshops, Dec. 7, 2006, pp. 663-666.
Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.
Lee.M et al., "15.4:Excellent Performance of Indium—Oxide-Based Thin-Film Transistors by DC Sputtering", SID Digest '09 : SID International Symposium Digest of Technical Papers, May 31, 2009, pp. 191-193.
Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.
Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Miyasaka.M, "SUFTLA Flexible Microelectronics on Their Way to Business", SID Digest '07 : SID International Symposium Digest of Technical Papers, 2007, vol. 38, pp. 1673-1676.
Mo.Y et al., "Amorphous Oxide TFT Backplanes for Large Size AMOLED Displays", IDW '08 : Proceedings of the 6th International Display Workshops, Dec. 3, 2008, pp. 581-584.
Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.
Nakamura.M, "Synthesis of Homologous Compound with New Long-Period Structure", NIRIM Newsletter, Mar. 1, 1995, vol. 150, pp. 1-4.
Nomura.K et al., "Amorphous Oxide Semiconductors.For High-Performance Flexible Thin-Film Transistors", Jpn. J. Appl. Phys. (Japanese Journal of Applied Physics) , 2006, vol. 45, No. 5B, pp. 4303-4308.
Nomura.K et al., "Carrier transport in transparent oxide semiconductor with intrinsic structural randomness probed using single-crystalline InGaO3(ZnO)5 films", Appl, Phys. Lett. (Applied Physics Letters) , Sep. 13, 2004, vol. 85, No. 11, pp. 1993-1995.
Nomura.K et al., "Room-Temperature Fabrication of Transparent Flexible Thin-Film Transistors Using Amorphous Oxide Semiconductors", Nature, Nov. 25, 2004, vol. 432, pp. 488-492.
Nomura.K et al., "Thin-Film Transistor Fabricated in Single-Crystalline Transparent Oxide Semiconductor", Science, May 23, 2003, vol. 300, No. 5623, pp. 1269-1272.
Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.
Oba.F et al., "Defect energetics in ZnO: A hybrid Hartree-Fock density functional study", Phys. Rev. B (Physical Review. B), 2008, vol. 77, pp. 245202-1-245202-6.
Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.
Ohara.H et al., "21.3:4.0 In. QVGA AMOLED Display Using In—Ga—Zn—Oxide TFTs With a Novel Passivation Layer", SID Digest '09 : SID International Symposium Digest of Technical Papers, May 31, 2009, pp. 284-287.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Orita.M et al., "Amorphous transparent conductive oxide InGaO3(ZnO)m (m <4):a Zn4s conductor", Philosophical Magazine, 2001, vol. 81, No. 5, pp. 501-515.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.
Osada.T et al., "Development of Driver-Integrated Panel Using Amorphous In—Ga—Zn—Oxide TFT", AM-FPD '09 Digest of Technical Papers, Jul. 1, 2009, pp. 33-36.
Park.J et al., "Amorphous Indium—Gallium—Zinc Oxide TFTs and Their Application for Large Size AMOLED", AM-FPD '08 Digest of Technical Papers, Jul. 2, 2008, pp. 275-278.
Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.
Park.J et al., "Electronic Transport Properties of Amorphous Indium—Gallium—Zinc Oxide Semiconductor Upon Exposure to Water", Appl. Phys. Lett. (Applied Physics Letters) , 2008, vol. 92, pp. 072104-1-072104-3.
Park.J et al., "High performance amorphous oxide thin film transistors with self-aligned top-gate structure", IEDM 09: Technical Digest of International Electron Devices Meeting, Dec. 7, 2009, pp. 191-194.
Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.
Park.S et al., "Challenge to Future Displays: Transparent AM-OLED Driven by Peald Grown ZnO TFT", IMID '07 Digest, 2007, pp. 1249-1252.
Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.
Prins.M et al., "A Ferroelectric Transparent Thin-Film Transistor", Appl. Phys. Lett. (Applied Physics Letters) , Jun. 17, 1996, vol. 68, No. 25, pp. 3650-3652.
Sakata.J et al., "Development of 4.0-In. AMOLED Display With Driver Circuit Using Amorphous In—Ga—Zn—Oxide TFTs", IDW '09 : Proceedings of the 16th International Display Workshops, 2009, pp. 689-692.
Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.
Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.
Tsuda.K et al., "Ultra Low Power Consumption Technologies for Mobile TFT-LCDs ", IDW '02 : Proceedings of the 9th International Display Workshops, Dec. 4, 2002, pp. 295-298.
Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.
Kimizuka.N. et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.

(56) References Cited

OTHER PUBLICATIONS

Kimizuka.N. et al., "Syntheses and Single-Crystal Data of Homologous Compounds, In2O3(ZnO)m (m=3, 4, and 5), InGaO3(ZnO)3, and Ga2O3(ZnO)m (3=7, 8, 9, and 16) in the In2O3—ZnGa2O4—ZnO System", Journal of Solid State Chemistry, Apr. 1, 1995, vol. 116, No. 1, pp. 170-178.

Yamazaki.S et al., "Research, Development, and Application of Crystalline Oxide Semiconductor", SID Digest '12 : SID International Symposium of Technical Papers, Jun. 5, 2012, pp. 183-186.

Yamazaki.S et al., "Properties of crystalline In—Ga—Zn—oxide semiconductor and its transistor characteristics", Jpn. J. Appl. Phys. (Japanese Journal of Applied Physics), Apr. 1, 2014, vol. 53, No. 4, pp. 04ED18-1-04ED18-10.

Matteucci.G et al., "An experiment on the particle-wave nature of electrons", Eur. J. Phys (European Journal of Physics), 2009, vol. 30, pp. 217-226.

Allowed Claims as of Oct. 29, 2015 (U.S. Appl. No. 14/294,626).

Notice of Allowance (U.S. Appl. No. 14/294,626) dated Oct. 29, 2015.

\* cited by examiner

InGaZnO$_4$ 3 nm

2nm

FIG. 10
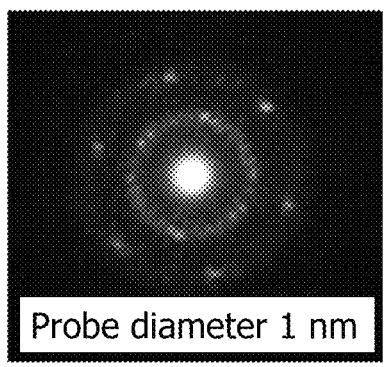
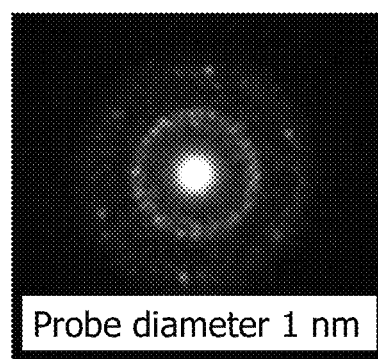
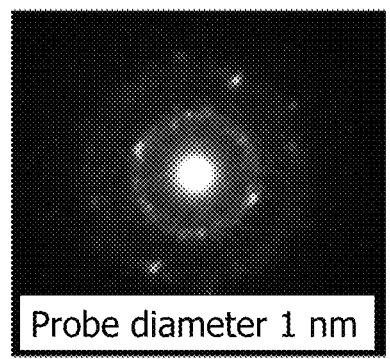
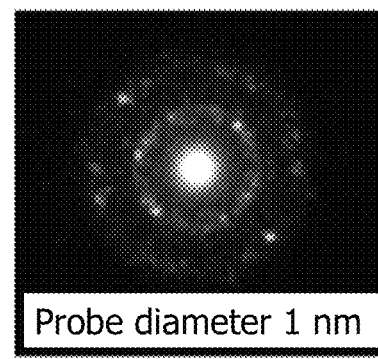

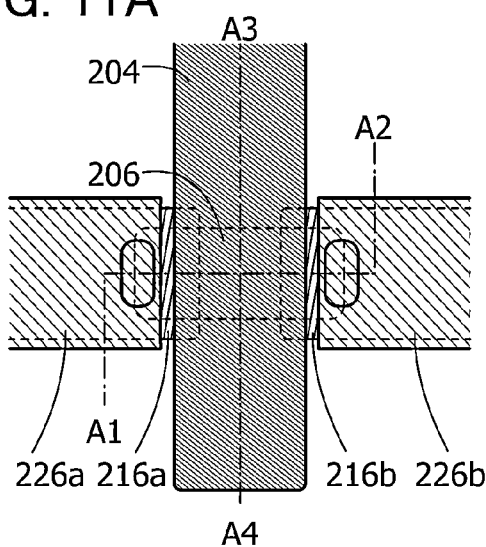
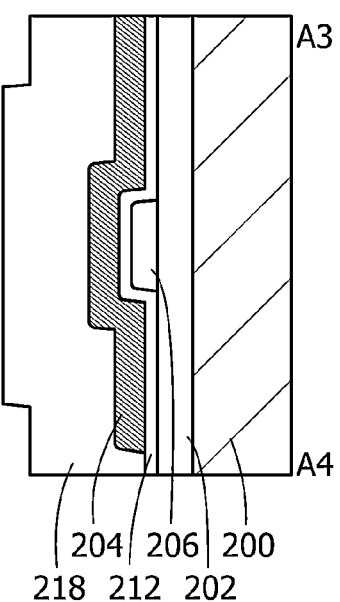
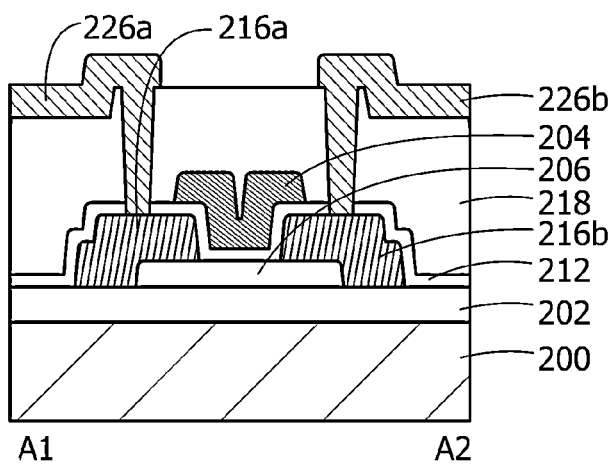
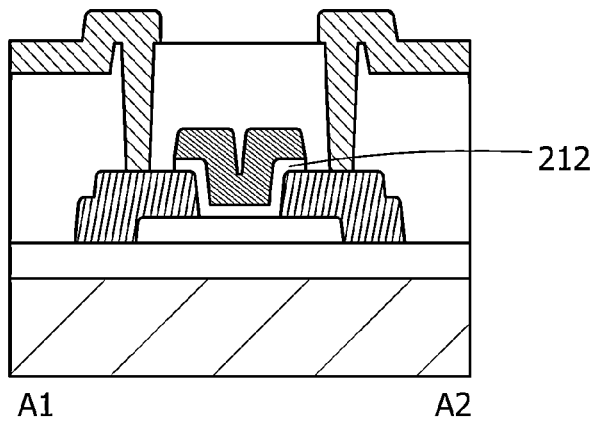

OXIDE SEMICONDUCTOR FILM, METHOD FOR FORMING OXIDE SEMICONDUCTOR FILM, AND SEMICONDUCTOR DEVICE

BACKGROUND OF THE INVENTION

1. Field of the Invention

The present invention relates to an object, a method, or a manufacturing method. In addition, the present invention relates to a process, a machine, manufacture, or a composition of matter. Specifically, the present invention relates to a semiconductor film, a semiconductor device, a display device, a liquid crystal display device, a light-emitting device, a driving method thereof, or a manufacturing method thereof, for example.

Note that in this specification, a semiconductor device refers to any device that can function by utilizing semiconductor characteristics. An electro-optical device, a display device, a memory device, a semiconductor circuit, an electronic appliance, and the like may be included in or may include a semiconductor device.

2. Description of the Related Art

Attention has been focused on a technique for forming a transistor using a semiconductor film which is formed on a substrate having an insulating surface. The transistor is applied to a wide range of semiconductor devices such as an integrated circuit and a display device. A silicon film is known as a semiconductor film applicable to a transistor.

As the silicon film used as a semiconductor film of a transistor, either an amorphous silicon film or a polycrystalline silicon film is used depending on the purpose. For example, in the case of a transistor included in a large-sized display device, it is preferred to use an amorphous silicon film, which can be formed using the established technique for forming a film on a large-sized substrate. On the other hand, in the case of a transistor included in a high-performance display device where driver circuits are formed over the same substrate, it is preferred to use a polycrystalline silicon film, which can form a transistor having a high field-effect mobility. As a method for forming a polycrystalline silicon film, high-temperature heat treatment or laser light treatment which is performed on an amorphous silicon film has been known.

In recent years, an oxide semiconductor film has attracted attention. For example, a transistor including an amorphous In—Ga—Zn oxide film is disclosed (see Patent Document 1). An oxide semiconductor film can be formed by a sputtering method or the like, and thus can be used for a semiconductor film of a transistor in a large display device. Moreover, a transistor including an oxide semiconductor film has a high field-effect mobility; therefore, a high-performance display device where driver circuits are formed over the same substrate can be obtained. In addition, there is an advantage that capital investment can be reduced because part of production equipment for a transistor including an amorphous silicon film can be retrofitted and utilized.

Synthesis of a single crystal In—Ga—Zn oxide was reported in 1985 (see Non-Patent Document 1). Furthermore, an In—Ga—Zn oxide having a homologous structure, which is represented by a composition formula, $InGaO_3(ZnO)_m$, (m is a natural number), was reported (see Non-Patent Document 2).

In addition, a transistor including a crystalline In—Ga—Zn oxide film which has excellent electrical characteristics and reliability as compared to a transistor including an amorphous In—Ga—Zn oxide film was reported (see Non-Patent Document 3). Non-Patent Document 3 reports that a crystal boundary is not clearly observed in an In—Ga—Zn oxide film including a c-axis aligned crystal (CAAC).

REFERENCE

Patent Document

[Patent Document 1] Japanese Published Patent Application No. 2006-165528

[Non-Patent Document 1] N. Kimizuka and T. Mohri, "Spinel, $YbFe_2O_4$, and $Yb_2Fe_3O_7$ Types of Structures for Compounds in the $In_2O_3$ and $Sc_2O_3$-$A_2O_3$—BO Systems [A: Fe, Ga, or Al; B: Mg, Mn, Fe, Ni, Cu, or Zn] at Temperatures over 1000° C.", *J. Solid State Chem.*, 1985, Vol. 60, pp. 382-384

[Non-Patent Document 2]: N. Kimizuka, M. Isobe, and M. Nakamura, "Syntheses and Single-Crystal Data of Homologous Compounds, $In_2O_3(ZnO)_m$, (m=3, 4, and 5), $InGaO_3(ZnO)_3$, and $Ga_2O_3(ZnO)_m$, (m=7, 8, 9, and 16) in the $In_2O_3$—$ZnGa_2O_4$—ZnO System", *J. Solid State Chem.*, 1995, Vol. 116, pp. 170-178

[Non-Patent Document 3] S. Yamazaki, J. Koyama, Y. Yamamoto, and K. Okamoto, "Research, Development, and Application of Crystalline Oxide Semiconductor", *SID 2012 DIGEST*, pp. 183-186

SUMMARY OF THE INVENTION

An object is to provide a crystalline oxide semiconductor film. Another object is to provide a method for forming the crystalline oxide semiconductor film.

Another object is to provide a sputtering target which enables the oxide semiconductor film to be formed.

Another object is to provide a method for using the sputtering target.

Another object is to provide a transistor including an oxide semiconductor film and having stable electrical characteristics.

Another object is to provide a highly reliable semiconductor device including the transistor.

Another object is to provide a semiconductor device with low off-state current. Another object of one embodiment of the invention is to provide a semiconductor device with low power consumption. Another object is to provide a novel semiconductor device.

Note that the descriptions of these objects do not disturb the existence of other objects. In one embodiment of the present invention, there is no need to achieve all the objects. Other objects will be apparent from and can be derived from the description of the specification, the drawings, the claims, and the like.

One embodiment of the present invention is an oxide semiconductor film including a plurality of flat-plate particles each having a structure in which layers including a gallium atom, a zinc atom, and an oxygen atom are provided over and under a layer including an indium atom and an oxygen atom. In the semiconductor film, the plurality of flat-plate particles face in random directions, and a crystal boundary is not observed using a transmission electron microscope.

Note that it is preferable that the plurality of flat-plate particles each have a thickness of greater than or equal to 0.5 nm and less than or equal to 0.9 nm and an equivalent circle diameter of a plane of greater than or equal to 1 nm and less than or equal to 3 nm. Furthermore, the plurality of flat-plate particles each have order of atomic arrangement.

Another embodiment of the present invention is a method for forming an oxide semiconductor film, including the steps of separating a plurality of flat-plate particles each having a structure in which layers including a gallium atom, a zinc atom, and an oxygen atom are provided over and under a layer including an indium atom and an oxygen atom, by collision of an ion with a target including a crystalline In—Ga—Zn oxide; and randomly depositing the plurality of flat-plate particles over a substrate having a surface temperature of higher than or equal to 15° C. and lower than or equal to 35° C.

Note that it is preferable that the crystalline In—Ga—Zn oxide included in the target be represented by a composition formula, $InGaZnO_4$.

Another embodiment of the present invention is a transistor including a gate electrode; a gate insulating film in contact with the gate electrode; and any of the above described oxide semiconductor films which faces the gate electrode with the gate insulating film positioned therebetween. Another embodiment of the present invention is a semiconductor device including the transistor.

A crystalline oxide semiconductor film can be provided.

In addition, a sputtering target which enables the oxide semiconductor film to be formed can be provided.

Furthermore, a transistor including an oxide semiconductor film and having stable electrical characteristics can be provided.

Moreover, a highly reliable semiconductor device including the transistor can be provided.

Furthermore, a semiconductor device with low off-state current can be provided. In addition, a semiconductor device with low power consumption can be provided. In addition, a novel semiconductor device can be provided.

BRIEF DESCRIPTION OF THE DRAWINGS

FIG. 10 shows nanobeam electron diffraction patterns of an nc-OS film thinned to several nanometers.

FIGS. 11A to 11C are a top view and cross-sectional views illustrating an example of a transistor of one embodiment of the present invention.

DETAILED DESCRIPTION OF THE INVENTION

Figure 1A:
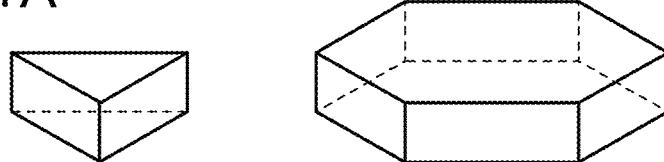
FIGS. 1A to 1D illustrate pellets.

Hereinafter, an embodiment of the present invention will be described in detail with the reference to the drawings. However, the present invention is not limited to the description below, and it is easily understood by those skilled in the art that modes and details disclosed herein can be modified in various ways. Further, the present invention is not construed as being limited to description of the embodiment. In describing structures of the present invention with reference to the drawings, common reference numerals are used for the same portions in different drawings. Note that the same hatched pattern is applied to similar parts, and the similar parts are not especially denoted by reference numerals in some cases.

Note that the size, the thickness of films (layers), or regions in drawings is sometimes exaggerated for simplicity.

A voltage usually refers to a potential difference between a given potential and a reference potential (e.g., a source potential or a ground potential (GND)). A voltage can be referred to as a potential and vice versa.

Note that the ordinal numbers such as "first" and "second" in this specification are used for convenience and do not denote the order of steps or the stacking order of layers. Therefore, for example, description can be made even when "first" is replaced with "second" or "third", as appropriate. In addition, the ordinal numbers in this specification do not correspond to the ordinal numbers which specify one embodiment of the present invention in some cases.

Note that a "semiconductor" includes characteristics of an "insulator" in some cases when the conductivity is sufficiently low, for example. Further, a "semiconductor" and an "insulator" cannot be strictly distinguished from each other in some cases because a border between the "semiconductor" and the "insulator" is not clear. Accordingly, a "semiconductor" in this specification can be called an "insulator" in some cases. Similarly, an "insulator" in this specification can be called a "semiconductor" in some cases.

Further, a "semiconductor" includes characteristics of a "conductor" in some cases when the conductivity is sufficiently high, for example. Further, a "semiconductor" and a "conductor" cannot be strictly distinguished from each other in some cases because a border between the "semiconductor" and the "insulator" is not clear. Accordingly, a "semiconductor" in this specification can be called a "conductor" in some cases. Similarly, a "conductor" in this specification can be called a "semiconductor" in some cases.

Note that an impurity in a semiconductor layer refers to, for example, elements other than the main components of a semiconductor layer. For example, an element with a concentration of lower than 0.1 atomic % is an impurity. When an impurity is contained, the density of states (DOS) in a semiconductor layer may be increased, the carrier mobility may be decreased, or the crystallinity may be decreased, for example. In the case where the semiconductor layer is an oxide semiconductor layer, examples of an impurity which changes characteristics of the semiconductor layer include Group 1 elements, Group 2 elements, Group 14 elements, Group 15 elements, and transition metals other than the main components; specifically, there are hydrogen (included in water), lithium, sodium, silicon, boron, phosphorus, carbon, and nitrogen, for example. In the case of an oxide semiconductor, oxygen vacancy may be formed by entry of impurities such as hydrogen. Further, when the semiconductor layer is a silicon layer, examples of an impurity which changes the characteristics of the semiconductor layer include oxygen, Group 1 elements except hydrogen, Group 2 elements, Group 13 elements, and Group 15 elements.

In this specification, the term "parallel" indicates that the angle formed between two straight lines is greater than or equal to −10° and less than or equal to 10°, and accordingly also includes the case where the angle is greater than or equal to −5° and less than or equal to 5°. In addition, the term "perpendicular" indicates that the angle formed between two straight lines ranges from 80° to 100°, and accordingly also includes the case where the angle ranges from 85° to 95°.

In this specification, trigonal and rhombohedral crystal systems are included in a hexagonal crystal system.

<Structure of Oxide Semiconductor Film>

A structure of an oxide semiconductor film which can be used as a semiconductor film of a transistor is described below.

An oxide semiconductor film is classified roughly into a single-crystal oxide semiconductor film and a non-single-crystal oxide semiconductor film. The non-single-crystal oxide semiconductor film includes any of a c-axis aligned crystalline oxide semiconductor (CAAC-OS) film, a polycrystalline oxide semiconductor film, a microcrystalline oxide semiconductor film, an amorphous oxide semiconductor film, and the like.

First, a CAAC-OS film is described.

The CAAC-OS film is one of oxide semiconductor films having a plurality of c-axis aligned crystal parts.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

The CAAC-OS film is an oxide semiconductor film having low impurity concentration. The impurity means an element other than main components of the oxide semiconductor film, such as hydrogen, carbon, silicon, or a transition metal element. In particular, an element that has higher bonding strength to oxygen than a metal element included in the oxide semiconductor film, such as silicon, disturbs the atomic arrangement of the oxide semiconductor film by depriving the oxide semiconductor film of oxygen and causes a decrease in crystallinity. Further, a heavy metal such as iron or nickel, argon, carbon dioxide, or the like has a large atomic radius (molecular radius), and thus disturbs the atomic arrangement of the oxide semiconductor film and causes a decrease in crystallinity when it is contained in the oxide semiconductor film. Note that the impurity contained in the oxide semiconductor film might serve as a carrier trap or a carrier generation source.

The CAAC-OS film is an oxide semiconductor film having a low density of defect states. In some cases, oxygen vacancy in the oxide semiconductor film serves as a carrier trap or serves as a carrier generation source when hydrogen is captured therein.

The state in which impurity concentration is low and density of defect states is low (the amount of oxygen vacancy is small) is referred to as a "highly purified intrinsic" or "substantially highly purified intrinsic" state. A highly purified intrinsic or substantially highly purified intrinsic oxide semiconductor film has few carrier generation sources, and thus can have a low carrier density. Thus, a transistor including the oxide semiconductor film rarely has negative threshold voltage (is rarely normally on). The highly purified intrinsic or substantially highly purified intrinsic oxide semiconductor film has few carrier traps. Accordingly, the transistor including the oxide semiconductor film has little variation in electrical characteristics and high reliability. Electric charge trapped by the carrier traps in the oxide semiconductor film takes a long time to be released, and might behave like fixed electric charge. Thus, the transistor which includes the oxide semiconductor film having high impurity concentration and a high density of defect states has unstable electrical characteristics in some cases.

With the use of the CAAC-OS film in a transistor, variation in the electrical characteristics of the transistor due to irradiation with visible light or ultraviolet light is small.

Next, a polycrystalline oxide semiconductor film is described.

In an image obtained with a TEM, for example, crystal grains can be found in the polycrystalline oxide semiconductor film. Moreover, in an image obtained with the TEM, a boundary between crystals can be found in the polycrystalline oxide semiconductor film in some cases.

The polycrystalline oxide semiconductor film has high crystallinity and thus has high electron mobility in some cases. Accordingly, a transistor including the polycrystalline oxide semiconductor film has high field-effect mobility. Note that there are cases in which an impurity is segregated at the grain boundary between the crystals in the polycrystalline oxide semiconductor film. Moreover, the grain boundary of the polycrystalline oxide semiconductor film becomes a defect state. Since the grain boundary of the polycrystalline oxide semiconductor film may serve as a carrier trap or a carrier generation source, a transistor including the polycrystalline oxide semiconductor film has larger variation in electrical characteristics and lower reliability than a transistor including a CAAC-OS film in some cases.

Next, a microcrystalline oxide semiconductor film is described.

In an image obtained with the TEM, crystal parts cannot be found clearly in the microcrystalline oxide semiconductor in some cases. In most cases, a crystal part in the microcrystalline oxide semiconductor is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal to 3 nm is specifically referred to as nanocrystal (nc). An oxide semiconductor film including nanocrystal is referred to as an nc-OS (nanocrystalline oxide semiconductor) film. In an image obtained with TEM, a crystal grain cannot be found clearly in the nc-OS film in some cases.

In the nc-OS film, a microscopic region (for example, a region with a size greater than or equal to 1 nm and less than or equal to 10 nm, in particular, a region with a size greater than or equal to 1 nm and less than or equal to 3 nm) has a periodic atomic order. Further, there is no regularity of crystal orientation between different crystal parts in the nc-OS film. Thus, the orientation of the whole film is not observed. Accordingly, in some cases, the nc-OS film cannot be distinguished from an amorphous oxide semiconductor depending on an analysis method. For example, when the nc-OS film is subjected to structural analysis by an out-of-plane method with an XRD apparatus using an X-ray having a diameter larger than that of a crystal part, a peak which shows a crystal plane does not appear. Further, a diffraction pattern like a halo pattern appears in a selected-area electron diffraction pattern of the nc-OS film which is obtained by using an electron beam having a probe diameter larger than the size of a crystal part (e.g., larger than or equal to 50 nmϕ). Meanwhile, spots are shown in a nanobeam electron diffraction pattern of the nc-OS film obtained by using an electron beam having a probe diameter close to, or smaller than or equal to the diameter of a crystal part (e.g., larger than or equal to 1 nm and smaller than or equal to 30 nm). Further, in a nanobeam electron diffraction pattern of the nc-OS film, spots are observed and regions with high luminance in a circular (ring) pattern are shown in some cases. Also in a nanobeam electron diffraction pattern of the nc-OS film, a plurality of spots is shown in a ring-like region in some cases.

The nc-OS film is an oxide semiconductor film that has high regularity as compared to an amorphous oxide semiconductor film. Therefore, the nc-OS film has a lower density of defect states than an amorphous oxide semiconductor film. Note that there is no regularity of crystal orientation between different crystal parts in the nc-OS film. Therefore, the nc-OS film has a higher density of defect states than the CAAC-OS film.

Accordingly, the nc-OS film has higher carrier density than the CAAC-OS film in some cases. The oxide semiconductor film having a high carrier density may have high electron mobility. Thus, a transistor including the nc-OS film has high field-effect mobility in some cases.

On the other hand, the transistor including the nc-OS film has smaller variation in electrical characteristics and higher reliability than a transistor including an amorphous oxide semiconductor film. The nc-OS film can be formed easily as compared to the CAAC-OS film because the nc-OS film can be obtained even when the amount of impurity contained therein is relatively large; thus, the nc-OS film is sometimes preferably used depending on the application. Therefore, a semiconductor device including the transistor including the nc-OS film can be manufactured with high productivity in some cases.

Next, an amorphous oxide semiconductor film is described.

The amorphous oxide semiconductor film has disordered atomic arrangement and no crystal part. For example, the amorphous oxide semiconductor film does not have a specific state as in quartz.

In an image obtained with a TEM, crystal parts cannot be found in the amorphous oxide semiconductor film.

The amorphous oxide semiconductor film contains impurities such as hydrogen at a high concentration. In addition, the amorphous oxide semiconductor film has a high density of defect states.

The oxide semiconductor film having a high impurity concentration and a high density of defect states has many carrier traps or many carrier generation sources.

Thus, the amorphous oxide semiconductor film has a much higher carrier density than the nc-OS film in some cases. Therefore, a transistor including the amorphous oxide semiconductor film tends to be normally on. Therefore, in some cases, such an amorphous oxide semiconductor layer can be applied to a transistor which needs to be normally on. Since the amorphous oxide semiconductor film has a high density of defect states, carrier traps might be increased. Consequently, a transistor including the amorphous oxide semiconductor film has larger variation in electrical characteristics and lower reliability than a transistor including the CAAC-OS film or the nc-OS film.

Next, a single-crystal oxide semiconductor film is described.

The single-crystal oxide semiconductor film has a lower impurity concentration and a lower density of defect states (a small amount of oxygen vacancy). Thus, the carrier density can be decreased. Therefore, a transistor using the single-crystal oxide semiconductor film is unlikely to be normally on. Moreover, since the single-crystal oxide semiconductor film has a lower impurity concentration and a lower density of defect states, carrier traps might be reduced. Therefore, a transistor using the single crystal oxide semiconductor film has a small variation in electrical characteristics and a high reliability in some cases Note that when the oxide semiconductor film has few defects, the density thereof is increased. When the oxide semiconductor film has high crystallinity, the density thereof is increased. When the oxide semiconductor film has a lower concentration of impurities such as hydrogen, the density thereof is increased. The single-crystal oxide semiconductor film has a higher density than the CAAC-OS film. The CAAC-OS film has a higher density than the microcrystalline oxide semiconductor film. The polycrystalline oxide semiconductor film has a higher density than the microcrystalline oxide semiconductor film. The microcrystalline oxide semiconductor film has a higher density than the amorphous oxide semiconductor film.

As described above, an oxide semiconductor film can have a variety of structures. Each structure has an advantage; therefore, in accordance with usage, an oxide semiconductor film having an optimal structure is preferably used.

<Deposition Model of Nc-OS Film>

An nc-OS film that is a crystalline oxide semiconductor film of one embodiment of the present invention is described below.

The nc-OS film can be deposited using a cleavage plane in a crystal. A deposition model of the nc-OS film using a sputtering method is described below.

Figure 2:
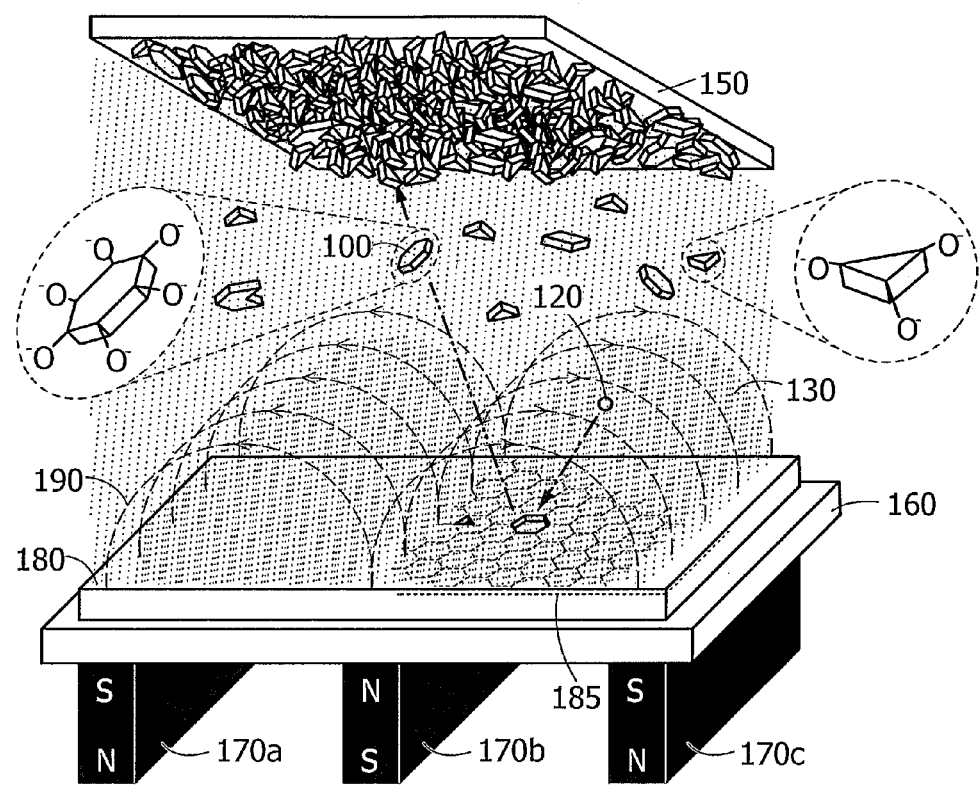
FIG. 2 is a model diagram showing a method for depositing an oxide semiconductor film of one embodiment of the present invention.

FIG. 2 is a schematic diagram of a deposition chamber illustrating a state where the nc-OS film is formed by a sputtering method.

A target 180 is attached to a backing plate 160. Under the target 180 and the backing plate 160, a magnet 170a, a magnet 170b, and a magnet 170c are placed. The magnet 170a, the magnet 170b, and the magnet 170c generate a magnetic field represented by magnetic force lines 190 over the target 180. Although the magnet 170a and the magnet 170c each have an S pole on the backing plate 160 side and the magnet 170b has an N pole on the backing plate 160 side, one embodiment of the present invention is not limited thereto. For example, the magnet 170a and the magnet 170c each may have an N pole on the backing plate 160 side and the magnet 170b may have an S pole on the backing plate 160 side.

The target 180 has a cleavage plane 185. Although the target 180 has a plurality of cleavage planes 185, only one cleavage plane is shown here for easy understanding.

A substrate 150 is placed to face the target 180. The deposition chamber is mostly filled with a deposition gas (e.g., an oxygen gas, an argon gas, or a mixed gas containing oxygen at 50 vol % or higher) and controlled to a low pressure (approximately 0.1 Pa to 10 Pa). Here, discharge starts by application of a voltage at a constant value or higher to the target 180, and plasma is observed. Note that the magnetic field over the target 180 makes the region 130 to be a high-density plasma region. In the region 130, the deposition gas is ionized, so that an ion 120 is formed. Examples of the ion 120 include an oxygen cation ($O^+$) and an argon cation ($Ar^+$).

The ion 120 is accelerated to the target 180 side by an electric field, and collides with the target 180 eventually. At this time, a pellet 100 which is a flat-plate-like (pellet-like) sputtered particle is separated and sputtered from the cleavage plane 185.

The shape of a flat plane of the pellet 100 may be a triangle (regular triangle) or a shape formed of two to six triangles. For example, a square (rhombus) is formed by combining two triangles (regular triangles), and a hexagon (regular hexagon) is formed by combining six triangles (regular triangles). FIG. 2 shows examples of the pellets 100 having a regular triangular flat plane, a rhombus flat plane, a flat plane formed of two rhombuses, and a regular hexagonal flat plane as typical flat-plane shapes of the pellet 100.

The pellet 100 receives a charge from plasma when passing through the region 130, so that end portions thereof are negatively or positively charged in some cases. FIG. 2 also illustrates an enlarged view showing the case where the flat plane of the pellet 100 is a regular hexagon and an enlarged view showing the case where the flat plane of the pellet 100 is a regular triangle. As illustrated in the enlarged views, the end portions of the pellet 100 are terminated with oxygen and there is a possibility that the oxygen is negatively charged. The end portions of the pellet 100 are charged in the same polarity, so that charges repel each other; thus, the pellet 100 can maintain a flat-plate shape.

An assumed example of the movement of the sputtered pellet 100 until the sputtered pellet 100 reaches the substrate 150 is described. For example, the pellet 100 flies linearly in plasma. By stacking the pellets 100 over the substrate 150, an nc-OS film can be obtained. In the case where the surface temperature of the substrate 150 is sufficiently low, migration of the pellets 100 hardly occur and the pellets 100 are deposited over the substrate 150 to face in random directions. The surface temperature of the substrate 150 may be, for example, room temperature (approximately 15° C. to 35° C.).

In this manner, laser crystallization is not needed for forming the nc-OS film; therefore, a uniform film can be deposited even over a large sized glass substrate. Furthermore, formation of the nc-OS film is possible when the surface temperature of the substrate 150 is about room temperature, and thus a substrate heating unit is unnecessary. Thus, the nc-OS film can be produced at a low cost.

Note that when the ion 120 collides with the target 180, there is a possibility that in addition to the pellet 100, an atom included in the target is sputtered; however, the mass of an atom is extremely lower than that of the pellet 100 and thus, it is considered that the atoms are mostly exhausted to the outside of the deposition chamber by a vacuum pump.

Note that the target 180 preferably contains a certain amount or more of indium. As described above, the pellet 100 has the shape in which an In—O layer is sandwiched between Ga—Zn—O layers or the like. In other words, the In—O layer serves as a core of the pellet 100. Accordingly, in the case where there is no In—O layer, the pellet 100 is difficult to maintain its shape and thus might become a deposition particle (deposition dust). For example, the proportion of indium contained in the entire target 180 is 1 atomic % or higher, preferably 2 atomic % or higher, more preferably 5 atomic % or higher, still more preferably 10 atomic % or higher.

In the case where the nc-OS film is used as a semiconductor film of a transistor and for example, the target 180 having the atomic ratio of metal elements of In:Ga:Zn=$x_1$:$y_1$:$z_1$ is used, $x_1/y_1$ is preferably greater than or equal to ⅓ and less than or equal to 6, more preferably greater than or equal to 1 and less than or equal to 6, and $z_1/y_1$ is preferably greater than or equal to ⅓ and less than or equal to 6, more preferably greater than or equal to 1 and less than or equal to 6. Note that when $z_1/y_1$ is greater than or equal to 1 and less than or equal to 6, an nc-OS film is easily formed. Examples of the atomic ratio of the metal elements included in the target are In:Ga:Zn=1:1:1, In:Ga:Zn=3:1:2, and In:Ga:Zn=5:5:6.

Alternatively, in the case where the nc-OS film is used as an oxide semiconductor film which protects a semiconductor film of a transistor and the target 180 having the atomic ratio of metal elements of In:Ga:Zn=$x_2$:$y_2$:$z_2$ is used, $x_2/y_2$ is preferably less than $x_1/y_1$, and $z_2/y_2$ is preferably greater than or equal to ⅓ and less than or equal to 6, more preferably greater than or equal to 1 and less than or equal to 6. Note that when $z_2/y_2$ is greater than or equal to 1 and less than or equal to 6, an nc-OS film is easily formed. Examples of the atomic ratio of the metal elements included in the target are In:Ga:Zn=1:3:2, In:Ga:Zn=1:3:3, In:Ga:Zn=1:3:4, In:Ga:Zn=1:3:6, In:Ga:Zn=1:3:8, and In:Ga:Zn=1:6:4.

The target 180 preferably has high crystallinity.

According to the deposition model described above, the nc-OS film can be obtained.

<Generation of Pellet>

A method for separating a pellet from a target having high crystallinity is described below.

Figure 3:
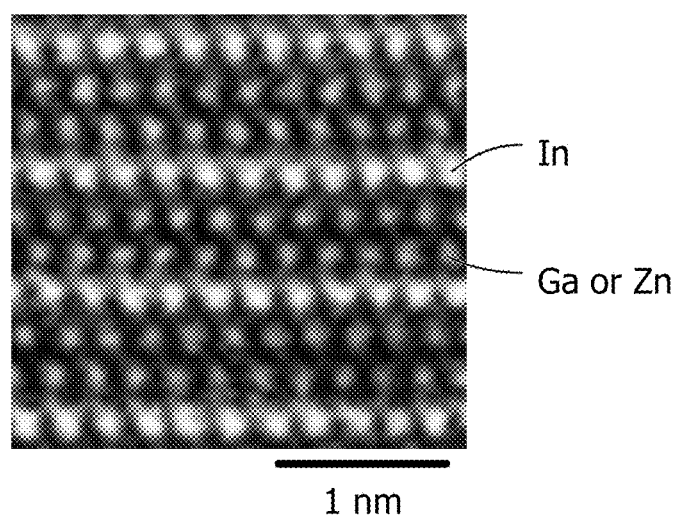
FIG. 3 shows a cross-sectional HAADF-STEM image of a target of one embodiment of the present invention.

FIG. 3 shows atomic arrangement in a cross section of a crystalline In—Ga—Zn oxide target. For observation of the atomic arrangement, a high-angle annular dark field scanning transmission electron microscopy (HAADF-STEM) was used. In the case of observation by HAADF-STEM, the intensity of an image of each atom is proportional to the square of its atomic number. Therefore, Zn (atomic number: 30) and Ga (atomic number: 31), whose atomic numbers are close to each other, are hardly distinguished from each other. A Hitachi scanning transmission electron microscope HD-2700 was used for the HAADF-STEM.

FIG. 3 indicates that the target has a layered atomic arrangement.

Figure 4A:
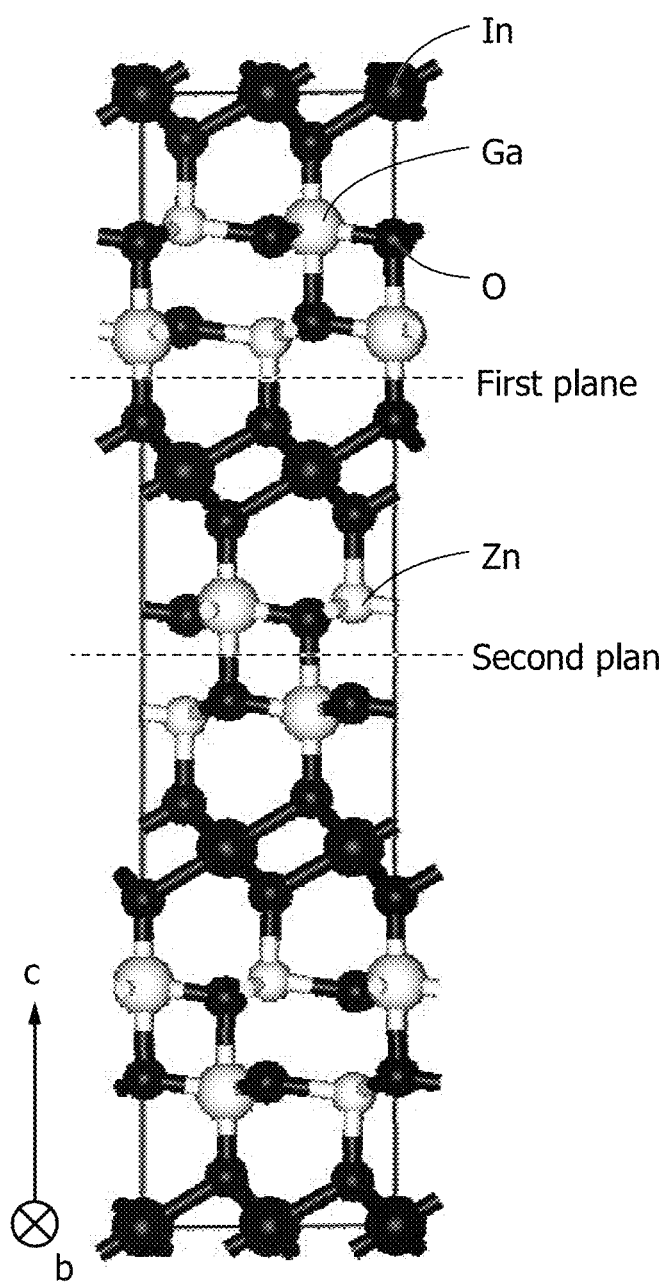
FIGS. 4A and 4B illustrate an $InGaZnO_4$ crystal.
Figure 4B:
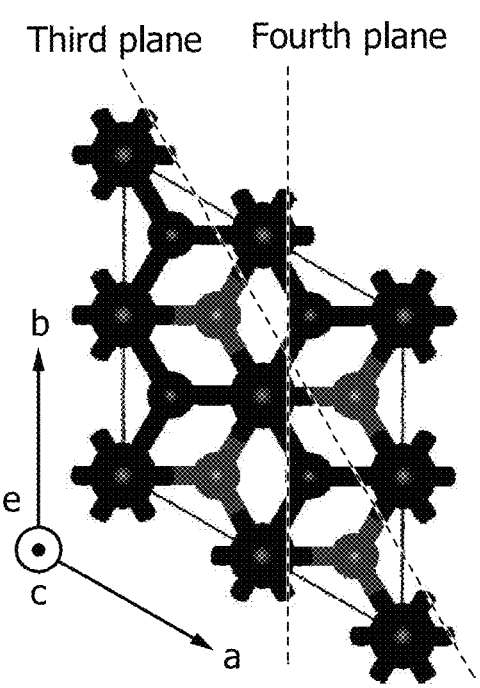

First, a cleavage plane of the target is described using FIGS. 4A and 4B. FIGS. 4A and 4B show a structure of an InGaZnO$_4$ crystal included in the target. Note that FIG. 4A shows a structure of the case where the InGaZnO$_4$ crystal is observed from a direction parallel to the b-axis when the c-axis is in an upward direction. Furthermore, FIG. 4B shows a structure of the case where the InGaZnO$_4$ crystal is observed from a direction parallel to the c-axis.

Energy needed for cleavage at each of crystal planes of the InGaZnO$_4$ crystal was calculated by the first principles calculation. Note that a pseudopotential and density functional theory program (CASTEP) using the plane wave basis were used for the calculation. Note that an ultrasoft type pseudopotential was used as the pseudopotential. GGA/PBE was used as the functional. Cut-off energy was 400 eV.

Energy of a structure in an initial state was obtained after structural optimization including a cell size was performed. Further, energy of a structure after the cleavage at each plane was obtained after structural optimization of atomic arrangement was performed in a state where the cell size was fixed.

On the basis of the structure of the InGaZnO$_4$ crystal shown in FIGS. 4A and 4B, a structure cleaved at any one of the first plane, the second plane, the third plane, and the fourth plane was formed and subjected to structural optimization calculation in which the cell size was fixed. Here, the first plane is a crystal plane between a Ga—Zn—O layer and an In—O layer and is parallel to the (001) plane (or the a-b plane) (see FIG. 4A). The second plane is a crystal plane between a Ga—Zn—O layer and a Ga—Zn—O layer and is parallel to the (001) plane (or the a-b plane) (see FIG. 4A). The third plane is a crystal plane parallel to the (110) plane (see FIG. 4B). The fourth plane is a crystal plane parallel to the (100) plane (or the b-c plane) (see FIG. 4B).

Under the above conditions, the energy of the structure at each plane after the cleavage was calculated. Next, a difference between the energy of the structure after the cleavage and the energy of the structure in the initial state was divided by the area of the cleavage plane; thus, cleavage energy which served as a measure of easiness of cleavage at each plane was calculated. Note that the energy of a structure indicates energy obtained in such a manner that electronic kinetic energy of electrons included in the structure and interactions between atoms included in the structure, between the atom and the electron, and between the electrons are considered.

As calculation results, the cleavage energy of the first plane was 2.60 J/m$^2$, that of the second plane was 0.68 J/m$^2$, that of the third plane was 2.18 J/m$^2$, and that of the fourth plane was 2.12 J/m$^2$ (see Table 1).

TABLE 1

|  | Cleavage Energy [J/m$^2$] |
| --- | --- |
| First Plane | 2.60 |
| Second Plane | 0.68 |
| Third Plane | 2.18 |
| Fourth Plane | 2.12 |

From the calculations, in the structure of the InGaZnO$_4$ crystal shown in FIGS. 4A and 4B, the cleavage energy at the second plane was the lowest. In other words, a plane between a Ga—Zn—O layer and a Ga—Zn—O layer was cleaved most easily (cleavage plane). Therefore, in this specification, the cleavage plane indicates the second plane, which is a plane where cleavage is performed most easily.

Since the cleavage plane is the second plane between a Ga—Zn—O layer and a Ga—Zn—O layer, the InGaZnO$_4$ crystals shown in FIG. 4A can be separated at a plane equivalent to two second planes. Thus, the minimum unit of the InGaZnO$_4$ crystal is considered to include two Ga—Zn—O layers and an In—O layer between the Ga—Zn—O layers. Separation occurs at two cleavage planes to obtain the pellet. Therefore, the pellet can also be called a cleavage unit.

It is found that when a target including the InGaZnO$_4$ crystal having a homologous structure is sputtered, separation occurs from the cleavage plane to form a pellet.

Figure 1B:
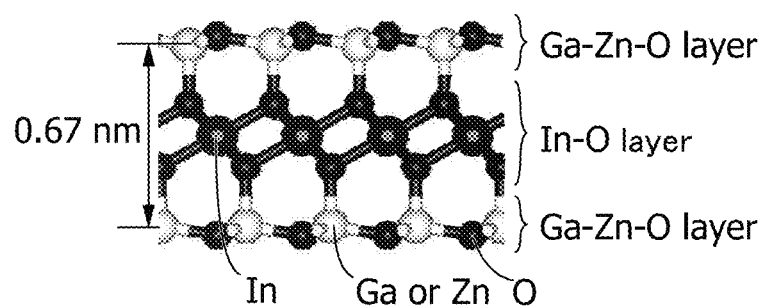
Figure 1C:
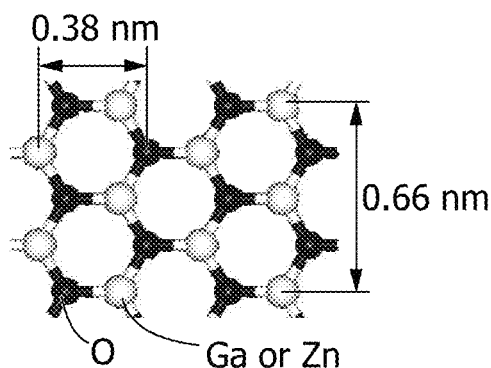

FIG. 1A shows a columnar pellet having a triangle flat surface and a columnar pellet having a hexagonal flat surface. The thickness of each pellet is expected to be approximately 0.7 nm (specifically 0.67 nm) from a position where a cleavage plane is formed (see FIG. 1B). The atomic arrangement of the pellet seen from the above is as shown in FIG. 1C.

Figure 1D:
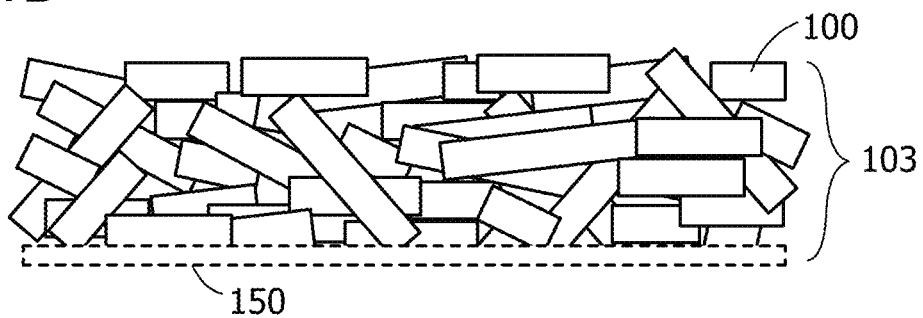

FIG. 1D is a schematic cross-sectional view of an nc-OS film 103 formed by the pellets 100 which are randomly deposited over the substrate 150. Since the pellets 100 are randomly deposited, although alignment is not observed in the whole nc-OS film 103, the pellets 100 each have the layered crystalline structure shown in FIGS. 1B and 1C. That is, each pellet 100 in the nc-OS film 103 has alignment. This suggests that the nc-OS film 103 has a distinctly different structure from an amorphous oxide semiconductor film which has short-range order but does not have alignment.

Here, easiness of formation of oxygen vacancy due to a difference in structure of an In—Ga—Zn oxide film is described. Oxygen vacancy in an In—Ga—Zn oxide film might serve as a carrier trap, or might serve as a carrier generation source when hydrogen is captured therein. Therefore, reducing oxygen vacancy is important for obtaining stable physical properties of an In—Ga—Zn oxide film.

The result of the density of localized states due to oxygen vacancy in the oxide semiconductor film measured by a constant photocurrent method (CPM) is described below.

A measurement sample included an oxide semiconductor film provided over a glass substrate, a pair of electrodes in contact with the oxide semiconductor film, and an insulating film covering the oxide semiconductor film and the pair of electrodes. Note that an amorphous-like oxide semiconductor film, an nc-OS film, and a CAAC-OS film were prepared as the oxide semiconductor film. Note that the amorphous-like oxide semiconductor film refers to an oxide semiconductor film which has a structure close to that of an amorphous oxide semiconductor film.

In the CPM measurement, the amount of light with which a surface of the measurement sample between terminals is irradiated is adjusted so that a photocurrent value is kept constant in the state where voltage is applied between a pair of electrodes provided in contact with the oxide semiconductor film, and then an absorption coefficient is calculated from the amount of the irradiation light in an intended wavelength range.

Figure 5A:
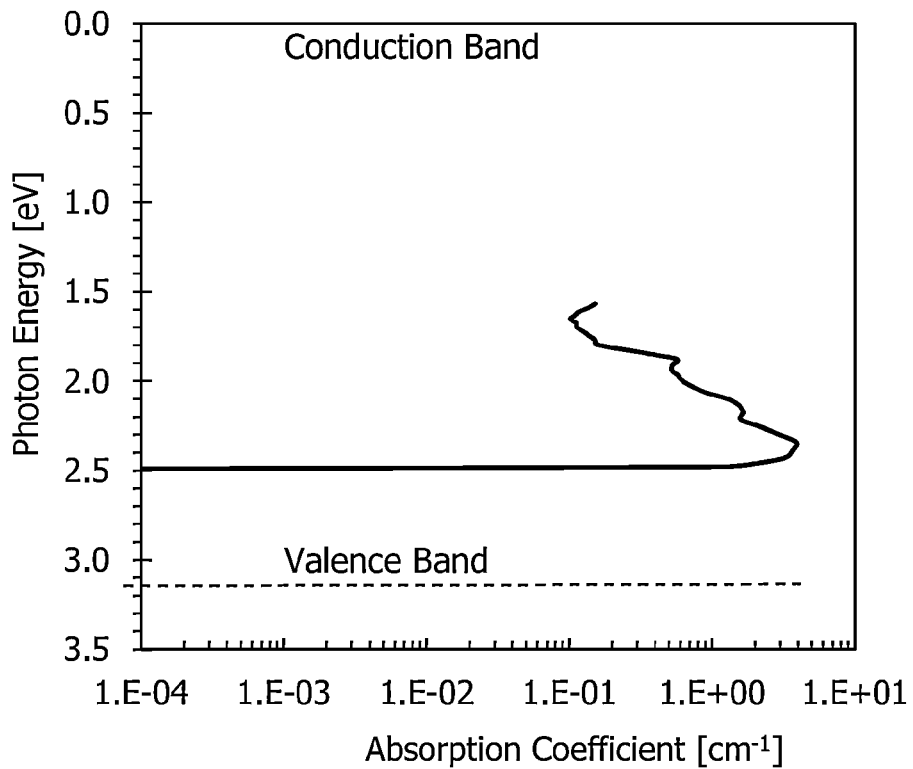
FIGS. 5A and 5B show CPM measurement results of an amorphous-like OS film and an nc-OS film.
Figure 5B:
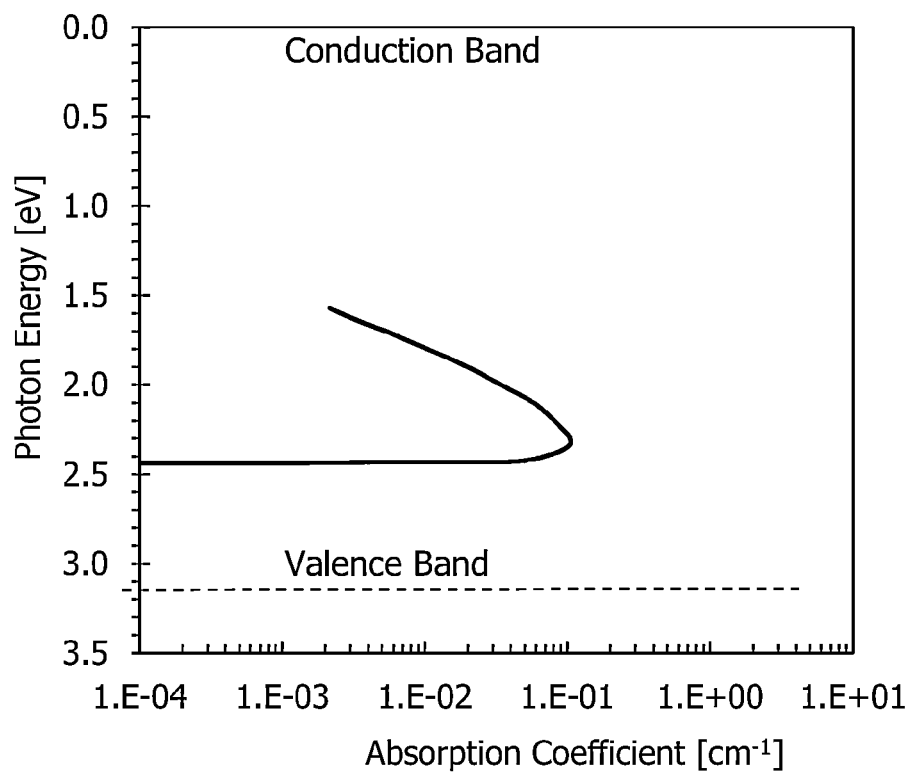
Figure 6:
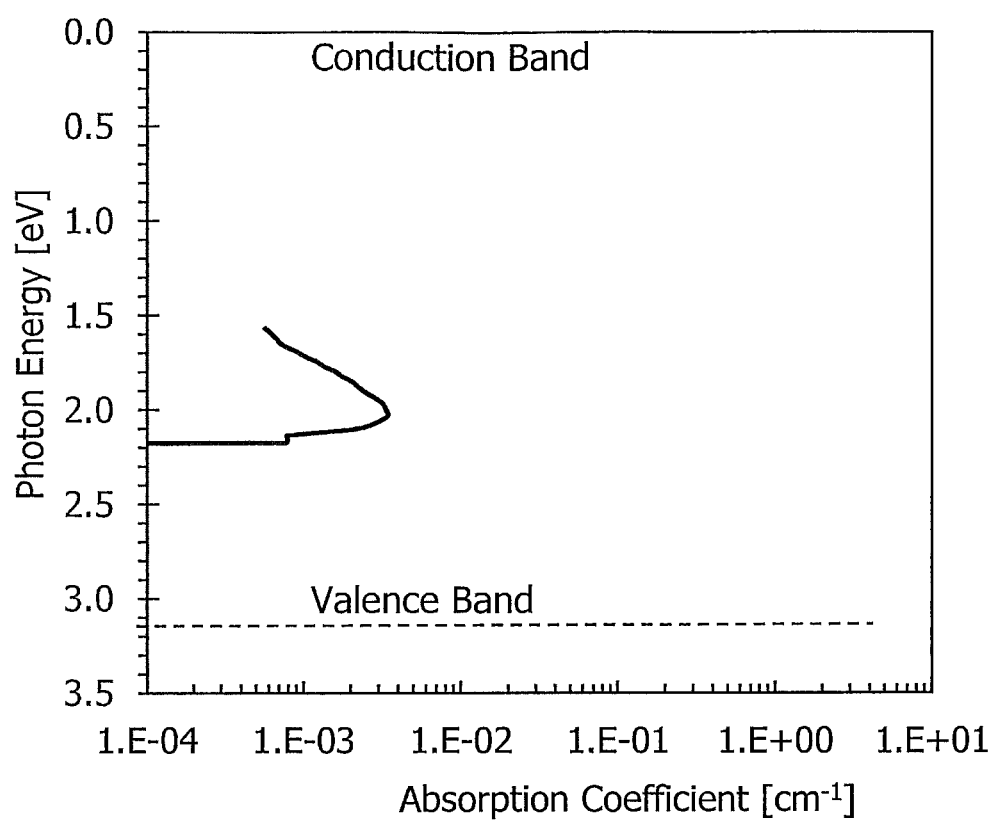
FIG. 6 shows the CPM measurement result of a CAAC-OS film.

FIGS. 5A and 5B and FIG. 6 each show absorption coefficient obtained by removal of an absorption coefficient due to the band tail. In FIGS. 5A and 5B and FIG. 6, the horizontal axis represents an absorption coefficient and the vertical axis represents optical energy. On the vertical axis in FIGS. 5A and 5B and FIG. 6, the bottom of the conduction band and the top of the valence band in the oxide semiconductor film are 0 eV and 3.15 eV, respectively. Each curve in FIGS. 5A and 5B and FIG. 6 represents a relation between the absorption coefficient and photon energy.

FIG. 5A shows a measurement result of the sample including the amorphous-like oxide semiconductor film, and the absorption coefficient due to oxygen vacancy was $5.28 \times 10^{-1}$ cm$^{-1}$. FIG. 5B shows a measurement result of the sample including the nc-OS film, and the absorption coefficient due to oxygen vacancy was $1.75 \times 10^{-2}$ cm$^{-1}$. FIG. 6 shows a measurement result of the sample including the CAAC-OS film, and the absorption coefficient due to oxygen vacancy was $5.86 \times 10^{-4}$ cm$^{-1}$. According to the results, the CAAC-OS film has the smallest amount of oxygen vacancy, the nc-OS film has the second smallest amount of oxygen vacancy, and the amorphous-like oxide semiconductor film has the largest amount of oxygen vacancy.

The amount of oxygen vacancy is probably derived from the degree of atomic arrangement order. That is, the amorphous-like oxide semiconductor film has random atomic arrangement and thus oxygen vacancy is likely to be generated therein. Furthermore, the CAAC-OS film has high order and thus oxygen vacancy is less likely to be generated therein. Moreover, although the nc-OS film has high order in the pellets, since the alignment of the whole film is random, the nc-OS film has an intermediate value between the amorphous-like oxide semiconductor film and the CAAC-OS film.

In view of bonding energy, oxygen bonded to indium is most likely to be released from the In—Ga—Zn oxide film. As described above, one pellet has a structure in which Ga—Zn—O layers are provided over and under an In—O layer (a wafer-like structure or a sandwich-like structure). Therefore, oxygen bonded to indium is unlikely to be released from the nc-OS film formed by the pellets, that is, oxygen vacancy is unlikely to be generated in the nc-OS film.

Furthermore, the nc-OS film can be formed when the substrate temperature at the time of deposition is about room temperature, and thus the nc-OS film is an oxide semiconductor film which is also favorable in view of productivity.

<Physical Properties of Nc-OS Film>

The physical properties of the nc-OS film deposited in the above manner are described below. Note that the case where the nc-OS film is an In—Ga—Zn oxide film is described.

Figure 7A:
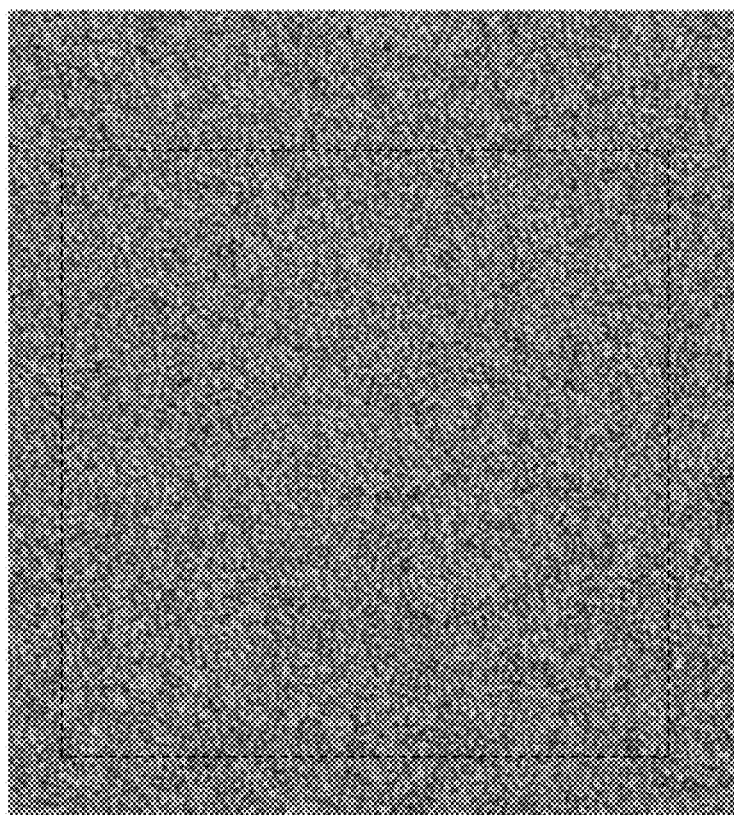
FIGS. 7A to 7C show a high-resolution planar TEM image of an nc-OS film, a Fourier transform image of the high-resolution planar TEM image, and a reverse Fourier transform image of the high-resolution planar TEM image.

FIG. 7A is a combined analysis image of a bright-field image obtained by a planar TEM observation and a diffraction pattern (the combined analysis image is also referred to as a high-resolution planar TEM image) of the nc-OS film. The high-resolution planar TEM image does not show distinct crystallinity of the nc-OS film. The high-resolution planar TEM image was obtained using a Hitachi H-9000NAR transmission electron microscope at an accelerating voltage to 300 kV.

Figure 7B:
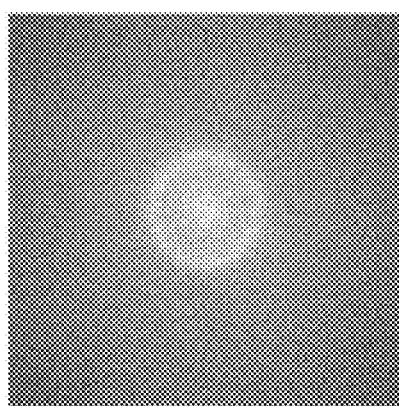

To evaluate periodicity of atomic arrangement, a portion surrounded by a dashed line in FIG. 7A was subjected to Fourier transform to obtain a Fourier transform image of the high-resolution planar TEM image (see FIG. 7B). The Fourier transform image of the high-resolution planar TEM image also does not show distinct crystallinity.

Figure 7C:
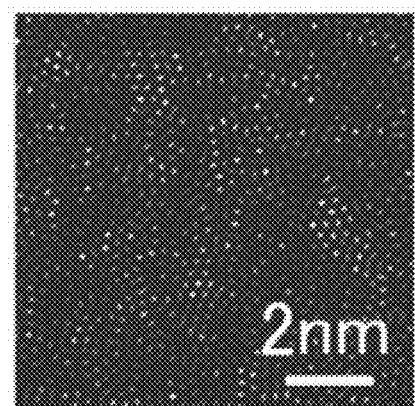

Next, to enhance the periodicity of the atomic arrangement, mask processing was performed on the Fourier transform image of the high-resolution planar TEM image so that only information of a region with high intensity remained, and then reverse Fourier transform was conducted to obtain a reverse Fourier transform image of the high-resolution planar TEM image (see FIG. 7C). As a result, the periodicity of the atomic arrangement was able to be observed in a small region with a size of approximately 1 nm to 3 nm. In other words, there is a possibility that a crystalline region with a size of approximately 1 nm to 3 nm exists in the nc-OS film.

The nc-OS film shown in FIGS. 7A to 7C was thinned to obtain Sample A with a thickness of approximately 50 nm, and then an electron diffraction pattern of Sample A was obtained from the cross-sectional side. Note that a nanometer-size electron beam with a probe diameter of 30 nm, 20 nm, 10 nm, or 1 nm was used for electron diffraction. A diffraction pattern obtained using a nanometer-size electron beam is referred to as a nanobeam electron diffraction pattern. Note that, the nanobeam electron diffraction pattern was obtained using a Hitachi HF-2000 field-emission transmission electron microscope under conditions where the accelerating voltage was 200 kV and the camera length was 400 mm. As a shooting medium, a film was used.

Figure 8:
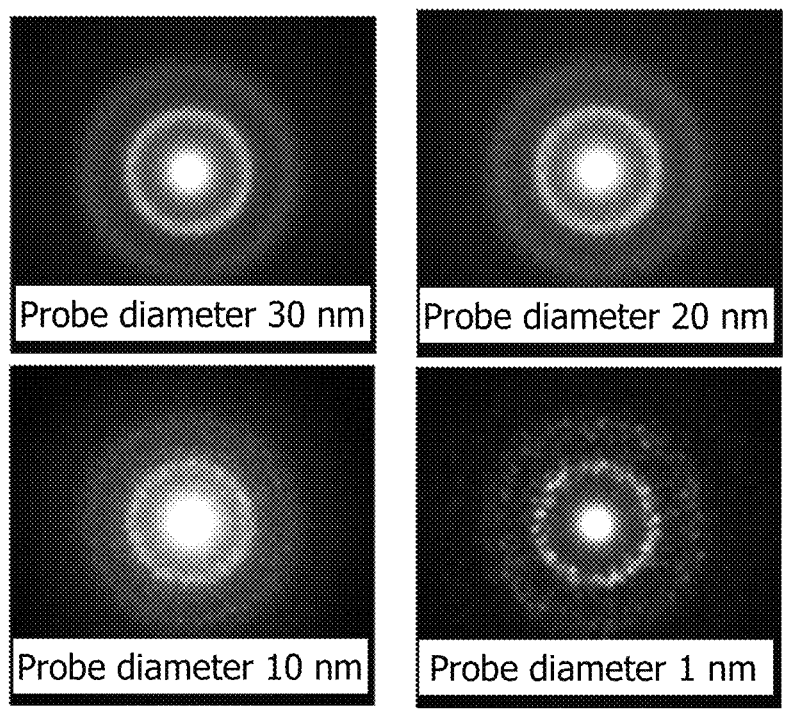
FIG. 8 shows nanobeam electron diffraction patterns of an nc-OS film.

As shown in FIG. 8, a ring-shaped nanobeam electron diffraction pattern was observed in Sample A. When the ring was observed in detail, spots were observed. The number of spots was increased as the probe diameter is reduced.

Figure 9:
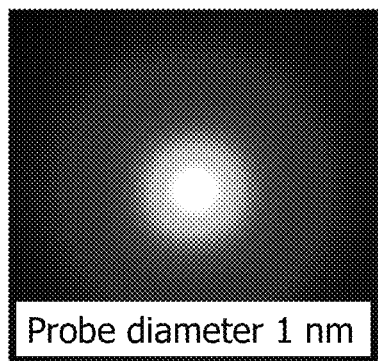
FIG. 9 shows a nanobeam electron diffraction pattern of a quartz substrate.

For comparison, when nanobeam electron diffraction was performed on quartz, which is in an amorphous state, using an electron beam with a probe diameter of 1 nm, a halo pattern shown in FIG. 9 was observed. Therefore, spots in the nanobeam electron diffraction pattern are evidence that Sample A is an nc-OS film.

To analyze the structure in more detail, the nc-OS film was thinned to obtain Sample B with a thickness of several nanometers (approximately greater than or equal to 5 nm and less than or equal to 10 nm). Then, an electron beam with a probe diameter of 1 nm entered Sample B from the cross-sectional side to obtain nanobeam electron diffraction patterns. As a result, as shown in FIG. 10, electron diffraction patterns having spots indicating crystallinity were obtained.

According to FIG. 10, diffraction patterns showing crystallinity were obtained from Sample B, but orientation along a crystal plane in a specific direction was not observed.

As described above, though an nc-OS film is not distinguished from an amorphous oxide semiconductor film in some cases depending on an analysis method, an exact analysis makes it possible to distinguish the nc-OS and the amorphous oxide semiconductor. Further, it is found that a microscopic region in the nc-OS film has a periodic atomic order. Therefore, the nc-OS film is an oxide semiconductor film that has high regularity as compared to an amorphous oxide semiconductor film.

<Application of Nc-OS Film>

The nc-OS film can be used as a semiconductor film of a transistor, for example.

<Transistor Including Nc-OS Film>

The structure of the transistor of one embodiment of the present invention and a manufacturing method thereof are described below.

<Transistor Structure (1)>

An example of a top-gate and top-contact transistor is described first.

FIGS. 11A to 11C are a top view and cross-sectional views of the transistor. FIG. 11A is the top view of the transistor. FIGS. 11B1 and 11B2 are each the cross-sectional view taken along dashed-dotted line A1-A2 in FIG. 11A. FIG. 11C is the cross-sectional view taken along dashed-dotted line A3-A4 in FIG. 11A.

In FIGS. 11B1 and 11B2, the transistor includes a base insulating film 202 over a substrate 200; an oxide semiconductor film 206 over the base insulating film 202; a source electrode 216a and a drain electrode 216b over the oxide semiconductor film 206; a gate insulating film 212 over the oxide semiconductor film 206, the source electrode 216a, and the drain electrode 216b; and a gate electrode 204 over the gate insulating film 212. Note that it is preferable that the transistor include a protective insulating film 218 over the source electrode 216a, the drain electrode 216b, the gate insulating film 212, and the gate electrode 204; and a wiring 226a and a wiring 226b over the protective insulating film 218. The gate insulating film 212 and the protective insulating film 218 have opening portions reaching the source electrode 216a and the drain electrode 216b, and the wiring 226a and the wiring 226b are in contact with the source electrode 216a and the drain electrode 216b, respectively through the openings. Note that the transistor does not necessarily include the base insulating film 202.

In FIG. 11A which is the top view, the distance between the source electrode 216a and the drain electrode 216b in a region where the oxide semiconductor film 206 and the gate electrode 204 overlap each other is called a channel length. Moreover, in the region where the oxide semiconductor film 206 and the gate electrode 204 overlap each other, a line connecting the center points in the region between the source electrode 216a and the drain electrode 216b is called a channel width. Note that a channel formation region refers to a region of the oxide semiconductor film 206 which is located between the source electrode 216a and the drain electrode 216b and over which the gate electrode 204 is located. Furthermore, a channel refers to a region of the oxide semiconductor film 206 through which current mainly flows.

Note that as illustrated in FIG. 11A, the gate electrode 204 is provided such that the channel formation region in the oxide semiconductor film 206 is located on the inner side of the gate electrode 204 in the top view. With such a structure, when light irradiation is performed from the gate electrode 204 side, generation of carriers in the oxide semiconductor film 206 due to light can be suppressed. In other words, the gate electrode 204 functions as a light-blocking film. Note that the oxide semiconductor film 206 may be provided to extend to the outside of the channel formation region in the gate electrode 204.

The oxide semiconductor film 206 is described below. The nc-OS film can be used as the oxide semiconductor film 206.

The oxide semiconductor film 206 is an oxide containing indium. An oxide can have a high carrier mobility (electron mobility) by containing indium, for example. Furthermore, the oxide semiconductor film 206 preferably contains an element M. The element M is aluminum, gallium, yttrium, or tin, for example. The element M is an element having a high bonding energy with oxygen, for example. The element M is an element that can increase the energy gap of the oxide, for example. In addition, the oxide semiconductor film 206 preferably contains zinc. When the oxide contains zinc, the oxide is easily to be crystallized, for example. The energy at the top of the valence band of the oxide can be controlled with the atomic ratio of zinc, for example.

Note that the oxide semiconductor film 206 is not limited to the oxide containing indium. The oxide semiconductor film 206 may be a Zn—Sn oxide or a Ga—Sn oxide, for example.

A first oxide semiconductor film and a second oxide semiconductor film may be provided over and under the channel formation region of the oxide semiconductor film 206. Note that the second oxide semiconductor film is provided between the oxide semiconductor film 206 and the gate insulating film 212.

The first oxide semiconductor film includes one or more elements other than oxygen included in the oxide semiconductor film 206. Since the first oxide semiconductor film includes one or more kinds of elements other than oxygen included in the oxide semiconductor film 206, an interface state is less likely to be formed at the interface between the oxide semiconductor film 206 and the first oxide semiconductor film.

The second oxide semiconductor film includes one or more elements other than oxygen included in the oxide semiconductor film 206. Since the second oxide semiconductor film includes one or more kinds of elements other than oxygen included in the oxide semiconductor film 206, an interface state is less likely to be formed at the interface between the oxide semiconductor film 206 and the second oxide semiconductor film.

In the case where the first oxide semiconductor film is an In-M-Zn oxide, when summation of In and M is assumed to be 100 atomic %, the proportions of In and M are preferably set to be less than 50 atomic % and greater than or equal to 50 atomic %, respectively, and further preferably less than 25 atomic % and greater than or equal to 75 atomic %, respectively. In the case where the oxide semiconductor film 206 is an In-M-Zn oxide, when summation of In and M is assumed to be 100 atomic %, the proportions of In and M are preferably set to be greater than or equal to 25 atomic % and less than 75 atomic %, respectively, and further preferably greater than or equal to 34 atomic % and less than 66 atomic %, respectively. In the case where the second oxide semiconductor film is an In-M-Zn oxide, when summation of In and M is assumed to be 100 atomic %, the proportions of In and M are preferably set to be less than 50 atomic % and greater than or equal to 50 atomic %, respectively, and further preferably less than 25 atomic % and greater than or equal to 75 atomic %, respectively. Note that the second oxide semiconductor film may be formed using the same kind of oxide as that of the first oxide semiconductor film.

Here, a mixed region of the first oxide semiconductor film and the oxide semiconductor film 206 might exist between the first oxide semiconductor film and the oxide semiconductor film 206. Furthermore, a mixed region of the oxide semiconductor film 206 and the second oxide semiconductor film might exist between the oxide semiconductor film 206 and the second oxide semiconductor film. The mixed region has a low density of interface states. Therefore, the stack including the first oxide semiconductor film, the oxide semiconductor film 206, and the second oxide semiconductor film has a band structure in which the energy continuously changes at the interfaces of the films (also referred to as continuous junction).

As the oxide semiconductor film 206, an oxide with a wide energy gap is used. For example, the energy gap of the oxide semiconductor film 206 is greater than or equal to 2.5 eV and less than or equal to 4.2 eV, preferably greater than or equal to 2.8 eV and less than or equal to 3.8 eV, further preferably greater than or equal to 3 eV and less than or equal to 3.5 eV.

As the first oxide semiconductor film, an oxide with a wide energy gap is used. For example, the energy gap of the first oxide semiconductor film is greater than or equal to 2.7 eV and less than or equal to 4.9 eV, preferably greater than or equal to 3 eV and less than or equal to 4.7 eV, further preferably greater than or equal to 3.2 eV and less than or equal to 4.4 eV.

As the second oxide semiconductor film, an oxide with a wide energy gap is used. The energy gap of the second oxide semiconductor film is greater than or equal to 2.7 eV and less than or equal to 4.9 eV, preferably greater than or equal to 3 eV and less than or equal to 4.7 eV, further preferably greater than or equal to 3.2 eV and less than or equal to 4.4 eV. Note that the first oxide semiconductor film and the second oxide semiconductor film have wider energy gaps than the oxide semiconductor film 206.

As the oxide semiconductor film 206, an oxide having an electron affinity higher than that of the first oxide semiconductor film is used. For example, as the oxide semiconductor film 206, an oxide having higher electron affinity than the first oxide semiconductor film by 0.07 eV or higher and 1.3 eV or lower, preferably 0.1 eV or higher and 0.7 eV or lower, further preferably 0.15 eV or higher and 0.4 eV or lower is used. Note that the electron affinity refers to an energy gap between the vacuum level and the bottom of the conduction band.

As the oxide semiconductor film 206, an oxide having an electron affinity higher than that of the second oxide semiconductor film is used. For example, as the oxide semiconductor film 206, an oxide having higher electron affinity than the second oxide semiconductor film by 0.07 eV or higher and 1.3 eV or lower, preferably 0.1 eV or higher and 0.7 eV or lower, further preferably 0.15 eV or higher and 0.5 eV or lower is used. Note that the electron affinity refers to an energy gap between the vacuum level and the bottom of the conduction band.

At this time, when an electric field is applied to the gate electrode 204, a channel is formed in the oxide semiconductor film 206, which has the highest electron affinity among the first oxide semiconductor film, the oxide semiconductor film 206, and the second oxide semiconductor film.

To increase the on-state current of the transistor, the thickness of the second oxide semiconductor film is preferably as small as possible. For example, the thickness of the second oxide semiconductor film is less than 10 nm, preferably less than or equal to 5 nm, further preferably less than or equal to 3 nm. Meanwhile, the second oxide semiconductor film has a function of blocking elements other than oxygen (such as silicon) included in the gate insulating film 212 from entering the oxide semiconductor film 206 where the channel is formed. Thus, the second oxide semiconductor film preferably has a certain thickness. For example, the thickness of the second oxide semiconductor film is greater than or equal to 0.3 nm, preferably greater than or equal to 1 nm, further preferably greater than or equal to 2 nm.

To improve reliability, preferably, the thickness of the first oxide semiconductor film is large, the thickness of the oxide semiconductor film 206 is small, and the thickness of the second oxide semiconductor film is small. Specifically, the thickness of the first oxide semiconductor film is greater than or equal to 20 nm, preferably greater than or equal to 30 nm, further preferably greater than or equal to 40 nm, still further preferably greater than or equal to 60 nm. With the first oxide semiconductor film having a thickness greater than or equal to 20 nm, preferably greater than or equal to 30 nm, further preferably greater than or equal to 40 nm, still further preferably greater than or equal to 60 nm, the distance from the interface between the base insulating film 202 and the first oxide semiconductor film to the oxide semiconductor film 206 where the channel is formed can be greater than or equal to 20 nm, preferably greater than or equal to 30 nm, further preferably greater than or equal to 40 nm, still further preferably greater than or equal to 60 nm. To prevent the productivity of the semiconductor device from being lowered, the thickness of the first oxide semiconductor film is less than or equal to 200 nm, preferably less than or equal to 120 nm, further preferably less than or equal to 80 nm. The thickness of the oxide semiconductor film 206 is greater than or equal to 3 nm and less than or equal to 100 nm, preferably greater than or equal to 3 nm and less than or equal to 80 nm, more preferably greater than or equal to 3 nm and less than or equal to 50 nm.

For example, the first oxide semiconductor film may be thicker than the oxide semiconductor film 206, and the oxide semiconductor film 206 may be thicker than the second oxide semiconductor film.

Influence of impurities in the oxide semiconductor film 206 is described below. In order to obtain stable electrical characteristics of a transistor, it is effective to reduce the concentration of impurities in the oxide semiconductor film 206 to have lower carrier density so that the oxide semiconductor film 206 is highly purified. The carrier density of the oxide semiconductor film 206 is lower than $1\times10^{17}/cm^3$, lower than $1\times10^{15}/cm^3$, or lower than $1\times10^{13}/cm^3$. In order to reduce the concentration of impurities in the oxide semiconductor film 206, the concentration of impurities in a film which is adjacent to the oxide semiconductor film 206 is preferably reduced.

For example, silicon in the oxide semiconductor film 206 might serve as a carrier trap or a carrier generation source. Therefore, the concentration of silicon in a region between the oxide semiconductor film 206 and the first oxide semiconductor film measured by secondary ion mass spectrometry (SIMS) is lower than $1\times10^{19}$ atoms/$cm^3$, preferably lower than $5\times10^{18}$ atoms/$cm^3$, further preferably lower than $2\times10^{18}$ atoms/$cm^3$. The concentration of silicon in a region between the oxide semiconductor film 206 and the second oxide semiconductor film measured by SIMS is lower than $1\times10^{19}$ atoms/$cm^3$, preferably lower than $5\times10^{18}$ atoms/$cm^3$, further preferably lower than $2\times10^{18}$ atoms/$cm^3$.

Furthermore, when hydrogen is contained in the oxide semiconductor film 206, the carrier density is increased in some cases. Thus, the concentration of hydrogen in the oxide semiconductor film 206, which is measured by SIMS, is lower than or equal to $2\times10^{20}$ atoms/$cm^3$, preferably lower than or equal to $5\times10^{19}$ atoms/$cm^3$, further preferably lower than or equal to $1\times10^{19}$ atoms/$cm^3$, still further preferably lower than or equal to $5\times10^{18}$ atoms/$cm^3$. When nitrogen is contained in the oxide semiconductor film 206, the carrier density is increased in some cases. The concentration of nitrogen in the oxide semiconductor film 206, which is measured by SIMS, is lower than $5\times10^{19}$ atoms/$cm^3$, preferably lower than or equal to $5\times10^{18}$ atoms/$cm^3$, further preferably lower than or equal to $1\times10^{18}$ atoms/$cm^3$, still further preferably lower than or equal to $5\times10^{17}$ atoms/$cm^3$.

It is preferable to reduce the concentration of hydrogen in the first oxide semiconductor film in order to reduce the concentration of hydrogen in the oxide semiconductor film 206. Thus, the concentration of hydrogen in the first oxide semiconductor film, which is measured by SIMS, is lower than or equal to $2\times10^{20}$ atoms/$cm^3$, preferably lower than or equal to $5\times10^{19}$ atoms/$cm^3$, further preferably lower than or equal to $1\times10^{19}$ atoms/$cm^3$, still further preferably lower than or equal to $5\times10^{18}$ atoms/$cm^3$. It is preferable to reduce the concentration of nitrogen in the first oxide semiconductor film in order to reduce the concentration of nitrogen in the oxide semiconductor film 206. The concentration of nitrogen in the first oxide semiconductor film, which is measured by SIMS, is lower than $5\times10^{19}$ atoms/$cm^3$, preferably lower than or equal to $5\times10^{18}$ atoms/$cm^3$, further preferably lower than or equal to $1\times10^{18}$ atoms/$cm^3$, still further preferably lower than or equal to $5\times10^{17}$ atoms/$cm^3$.

It is preferable to reduce the concentrations of hydrogen in the second oxide semiconductor film in order to reduce the concentrations of hydrogen in the oxide semiconductor film 206. Thus, the concentration of hydrogen in the second oxide semiconductor film, which is measured by SIMS, is lower than or equal to $2\times10^{20}$ atoms/$cm^3$, preferably lower than or equal to $5\times10^{19}$ atoms/$cm^3$, further preferably lower than or equal to $1\times10^{19}$ atoms/$cm^3$, still further preferably lower than or equal to $5\times10^{18}$ atoms/$cm^3$. It is preferable to reduce the concentration of nitrogen in the second oxide semiconductor film in order to reduce the concentration of nitrogen in the oxide semiconductor film 206. The concentration of nitrogen in the second oxide semiconductor film, which is measured by SIMS, is lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

For example, the base insulating film 202 illustrated in FIGS. 11A to 11C may be formed with a single layer or a stack using an insulating film including silicon oxide or silicon oxynitride. Furthermore, the base insulating film 202 is preferably an insulating film containing excess oxygen. For example, the thickness of the base insulating film 202 is greater than or equal to 20 nm and less than or equal to 1000 nm, preferably greater than or equal to 50 nm and less than or equal to 1000 nm, further preferably greater than or equal to 100 nm and less than or equal to 1000 nm, still further preferably greater than or equal to 200 nm and less than or equal to 1000 nm.

The base insulating film 202 may be, for example, a stacked film including a silicon nitride film as a first layer and a silicon oxide film as a second layer. Note that the silicon oxide film may be a silicon oxynitride film. A silicon nitride oxide film may be used instead of the silicon nitride film. It is preferable to use a silicon oxide film whose defect density is small as the silicon oxide film. Specifically, a silicon oxide film whose spin density attributed to a signal with a g factor of 2.001 in electron spin resonance (ESR) is lower than or equal to $3\times10^{17}$ spins/cm$^3$, preferably lower than or equal to $5\times10^{16}$ spins/cm$^3$ is used. As the silicon nitride film, a silicon nitride film from which hydrogen and ammonia are less released is used. The amount of released hydrogen and ammonia can be measured by TDS. Further, as the silicon nitride film, a silicon nitride film which does not transmit or hardly transmits hydrogen, water, and oxygen is used.

The base insulating film 202 may be, for example, a stacked film including a silicon nitride film as a first layer, a first silicon oxide film as a second layer, and a second silicon oxide film as a third layer. In that case, the first and/or second silicon oxide film may be a silicon oxynitride film. A silicon nitride oxide film may be used instead of the silicon nitride film. It is preferable to use a silicon oxide film whose defect density is small as the first silicon oxide film. Specifically, a silicon oxide film whose spin density attributed to a signal with a g factor of 2.001 in ESR is lower than or equal to $3\times10^{17}$ spins/cm$^3$, preferably lower than or equal to $5\times10^{16}$ spins/cm$^3$ is used. As the second silicon oxide film, a silicon oxide film containing excess oxygen is used. As the silicon nitride film, a silicon nitride film from which hydrogen and ammonia are less released is used. Further, as the silicon nitride film, a silicon nitride film which does not transmit or hardly transmits hydrogen, water, and oxygen is used.

For example, the source electrode 216a and the drain electrode 216b may be formed with a single layer or a stacked layer of a conductive film containing one or more kinds of aluminum, titanium, chromium, cobalt, nickel, copper, yttrium, zirconium, molybdenum, ruthenium, silver, tantalum, and tungsten.

Figure 12A:
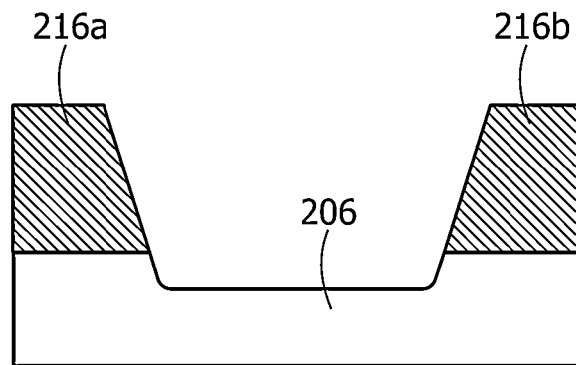
FIGS. 12A to 12C are cross-sectional views each illustrating part of a transistor of one embodiment of the present invention.
Figure 12B:
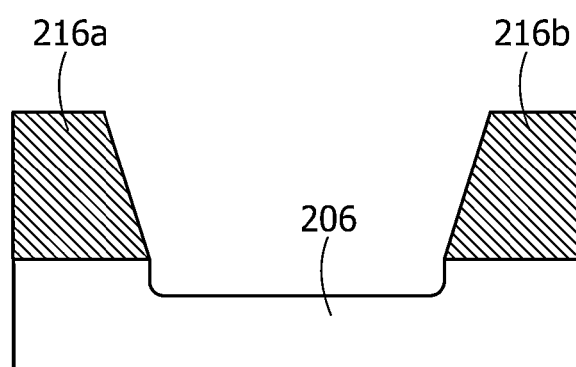
Figure 12C:
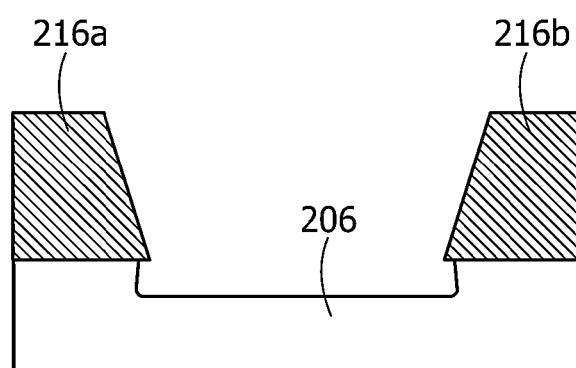

In forming the source electrode 216a and the drain electrode 216b, part of the oxide semiconductor film 206 might be etched to form a groove. FIGS. 12A to 12C each illustrate an example in which a groove is formed in a region of the oxide semiconductor film 206 over which neither the source electrode 216a nor the drain electrode 216b is provided.

FIG. 12A illustrates an example in which a groove is formed in the oxide semiconductor film 206 by anisotropic etching or the like. The side surface of the groove formed in the oxide semiconductor film 206 has a tapered shape. The shape illustrated in FIG. 12A can increase step coverage with the gate insulating film 212 or the like formed later. Therefore, the use of the transistor with the groove having the above shape can increase the yield of the semiconductor device.

FIG. 12B illustrates an example in which a groove is formed in the oxide semiconductor film 206 by anisotropic etching or the like. The groove having the shape illustrated in FIG. 12B can be obtained in such a manner that the oxide semiconductor film 206 is etched at a high etching rate as compared to that of the case where the groove having the shape illustrated in FIG. 12A is formed. The groove formed in the oxide semiconductor film 206 has a shape whose side surface has a steep angle. The shape illustrated in FIG. 12B is suitable for reduction in the size of the transistor. Therefore, the use of the transistor with the groove having the above shape can increase the degree of integration of the semiconductor device.

FIG. 12C illustrates an example in which a groove is formed in the oxide semiconductor film 206 by isotropic etching or the like. The surfaces of the groove formed in the oxide semiconductor film 206 are positioned on the inner side of the edges of the source electrode 216a and the drain electrode 216b. In the transistor illustrated in FIG. 12C, damage to the channel formation region is small. Therefore, the use of the transistor with the groove having the above shape can increase the reliability of the semiconductor device.

For example, the gate insulating film 212 may be formed using a single layer or a stacked layer of an insulating film containing one or more kinds of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The gate insulating film 212 is preferably formed using an insulating film containing excess oxygen. The thickness (or equivalent oxide thickness) of the gate insulating film 212 is, for example, greater than or equal to 1 nm and less than or equal to 500 nm, preferably greater than or equal to 3 nm and less than or equal to 300 nm, further preferably greater than or equal to 5 nm and less than or equal to 100 nm, still further preferably greater than or equal to 5 nm and less than or equal to 50 nm.

The gate insulating film 212 may be, for example, a stacked film including a silicon nitride film as a first layer and a silicon oxide film as a second layer. Note that the silicon oxide film may be a silicon oxynitride film. A silicon nitride oxide film may be used instead of the silicon nitride film. It is preferable to use a silicon oxide film whose defect density is small as the silicon oxide film. Specifically, a silicon oxide film whose spin density attributed to a signal with a g factor of 2.001 in ESR is lower than or equal to $3\times10^{17}$ spins/cm$^3$, preferably lower than or equal to $5\times10^{16}$ spins/cm$^3$ is used. As the silicon oxide film, a silicon oxide film containing excess oxygen is preferably used. As the silicon nitride film, a silicon nitride film from which a hydrogen gas and an ammonia gas are less released is used. The amount of released hydrogen gas and ammonia gas can be measured by TDS.

For example, the gate electrode 204 may be formed of a single layer or a stacked layer of a conductive film containing one or more kinds of aluminum, titanium, chromium, cobalt, nickel, copper, yttrium, zirconium, molybdenum, ruthenium, silver, tantalum, and tungsten.

The protective insulating film 218 may be formed with a single layer or a stacked layer of an insulating film containing one or more kinds of silicon oxide, silicon oxynitride, germanium oxide, yttrium oxide, zirconium oxide, lanthanum oxide, neodymium oxide, hafnium oxide, and tantalum oxide, for example. The protective insulating film 218 is preferably used using an insulating film containing excess oxygen. An insulating film which blocks oxygen may be used as the protective insulating film 218. For example, the thickness of the protective insulating film 218 is greater than or equal to 20 nm and less than or equal to 1000 nm, preferably greater than or equal to 50 nm and less than or equal to 1000 nm, further preferably greater than or equal to 100 nm and less than or equal to 1000 nm, still further preferably greater than or equal to 200 nm and less than or equal to 1000 nm.

The wiring 226a and the wiring 226b may be formed using a single layer or a stacked layer of a conductive film containing one or more kinds of aluminum, titanium, chromium, cobalt, nickel, copper, yttrium, zirconium, molybdenum, ruthenium, silver, tantalum, and tungsten, for example.

There is no particular limitation on the substrate 200. For example, a glass substrate, a ceramic substrate, a quartz substrate, a sapphire substrate, or the like may be used as the substrate 200. Alternatively, a single crystal semiconductor substrate or a polycrystalline semiconductor substrate made of silicon, silicon carbide, or the like, a compound semiconductor substrate made of silicon germanium or the like, a silicon-on-insulator (SOI) substrate, or the like may be used as the substrate 200. Still alternatively, any of these substrates provided with a semiconductor element may be used as the substrate 200.

Further alternatively, a flexible substrate may be used as the substrate 200. Note that as a method for forming a transistor over a flexible substrate, there is also a method in which, after a transistor is formed over a non-flexible substrate, the transistor is separated from the non-flexible substrate and transferred to a flexible substrate corresponding to the substrate 200. In that case, a separation layer is preferably provided between the non-flexible substrate and the transistor.

<Transistor Structure (2)>

Next, an example of a bottom-gate and top-contact transistor is described.

Figure 13A:
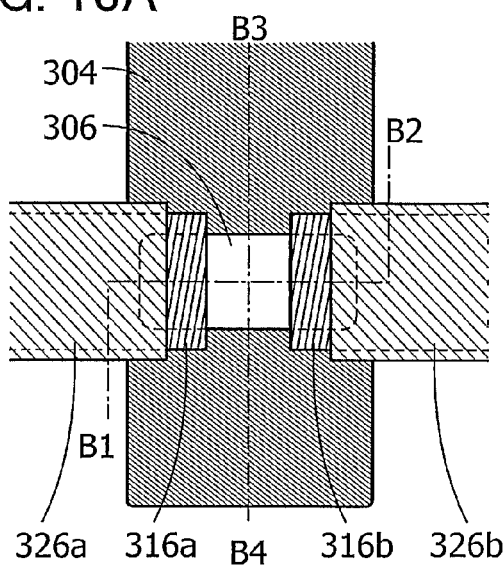
FIGS. 13A to 13C are a top view and cross-sectional views illustrating an example of a transistor of one embodiment of the present invention.
Figure 13C:
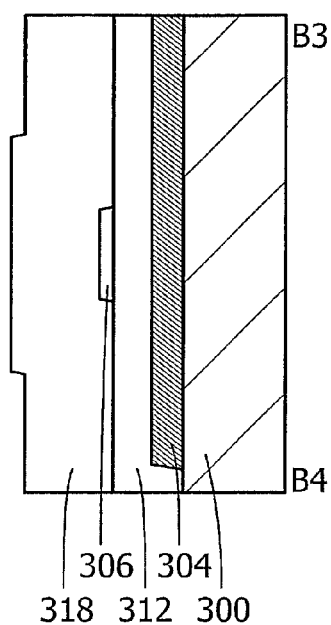
Figure 13B:
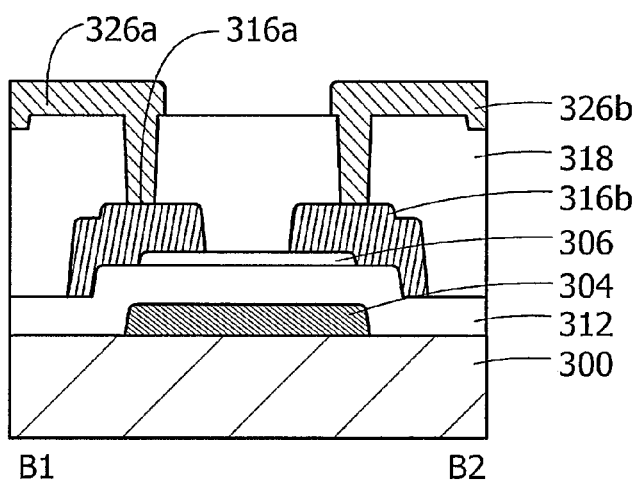

FIGS. 13A to 13C are a top view and cross-sectional views of the transistor. FIG. 13A is a top view of the transistor. FIG. 13B is a cross-sectional view taken along dashed-dotted line B1-B2 in FIG. 13A. FIG. 13C is a cross-sectional view taken along dashed-dotted line B3-B4 in FIG. 13A.

In FIG. 13B, the transistor includes a gate electrode 304 over a substrate 300, a gate insulating film 312 over the gate electrode 304, an oxide semiconductor film 306 over the gate insulating film 312, and a source electrode 316a and a drain electrode 316b over the oxide semiconductor film 306. Note that it is preferable that the transistor include a protective insulating film 318 over the source electrode 316a, the drain electrode 316b, the gate insulating film 312, and the oxide semiconductor film 306; and a wiring 326a and a wiring 326b over the protective insulating film 318. Furthermore, the protective insulating film 318 includes opening portions reaching the source electrode 316a and the drain electrode 316b, and the wiring 326a and the wiring 326b are in contact with the source electrode 316a and the drain electrode 316b, respectively, through the openings.

Note that the transistor may include a base insulating film between the substrate 300 and the gate electrode 304.

The description of the transistor illustrated in FIGS. 11A to 11C is referred to for part of the description of the transistor illustrated in FIGS. 13A to 13C.

For example, the description of the substrate 200 is referred to for the substrate 300. The description of the oxide semiconductor film 206 is referred to for the oxide semiconductor film 306. The description of the source electrode 216a and the drain electrode 216b is referred to for the source electrode 316a and the drain electrode 316b. The description of the gate insulating film 212 is referred to for the gate insulating film 312. The description of the gate electrode 204 is referred to for the gate electrode 304. The description of the wiring 226a and the wiring 226b is referred to for the wiring 326a and the wiring 326b.

Note that as illustrated in FIG. 13A, the gate electrode 304 is provided such that the oxide semiconductor film 306 is located on the inner side of the gate electrode 304 in the top view. With such a structure, when light irradiation is performed from the gate electrode 304 side, generation of carriers in the oxide semiconductor film 306 due to light can be suppressed. In other words, the gate electrode 304 functions as a light-blocking film. Note that the oxide semiconductor film 306 may be provided to extend to the outside of the gate electrode 304.

For example, the protective insulating film 318 illustrated in FIGS. 13A to 13C may be formed with a single layer or a stack using an insulating film including silicon oxide or silicon oxynitride. Furthermore, the protective insulating film 318 is preferably an insulating film containing excess oxygen. For example, the thickness of the protective insulating film 318 is greater than or equal to 20 nm and less than or equal to 1000 nm, preferably greater than or equal to 50 nm and less than or equal to 1000 nm, further preferably greater than or equal to 100 nm and less than or equal to 1000 nm, still further preferably greater than or equal to 200 nm and less than or equal to 1000 nm.

The protective insulating film 318 may be, for example, a stacked film including a silicon oxide film as a first layer and a silicon nitride film as a second layer. Note that the silicon oxide film may be a silicon oxynitride film. A silicon nitride oxide film may be used instead of the silicon nitride film. It is preferable to use a silicon oxide film whose defect density is small as the silicon oxide film. Specifically, a silicon oxide film whose spin density attributed to a signal with a g factor of 2.001 in ESR is lower than or equal to $3 \times 10^{17}$ spins/cm$^3$, preferably lower than or equal to $5 \times 10^{16}$ spins/cm$^3$ is used. As the silicon nitride film, a silicon nitride film from which hydrogen and ammonia are less released is used. The amount of released hydrogen and ammonia can be measured by TDS. Further, as the silicon nitride film, a silicon nitride film which does not transmit or hardly transmits hydrogen, water, and oxygen is used.

The protective insulating film 318 may be, for example, a stacked film including a first silicon oxide film as a first layer, a second silicon oxide film as a second layer, and a silicon nitride film as a third layer. In that case, the first and/or second silicon oxide film may be a silicon oxynitride film. A silicon nitride oxide film may be used instead of the silicon nitride film. It is preferable to use a silicon oxide film whose defect density is small as the first silicon oxide film. Specifically, a silicon oxide film whose spin density attributed to a signal with a g factor of 2.001 in ESR is lower than or equal to $3 \times 10^{17}$ spins/cm$^3$, preferably lower than or equal to $5 \times 10^{16}$ spins/cm$^3$ is used. As the second silicon oxide film, a silicon oxide film containing excess oxygen is used.

As the silicon nitride film, a silicon nitride film from which hydrogen and ammonia are less released is used. Further, as the silicon nitride film, a silicon nitride film which does not transmit or hardly transmits hydrogen, water, and oxygen is used.

The above transistor can be used for various purposes such as a memory, a CPU, and a display device, for example.

<Display Device>

A display device including any of the above transistors is described below.

Figure 14A:
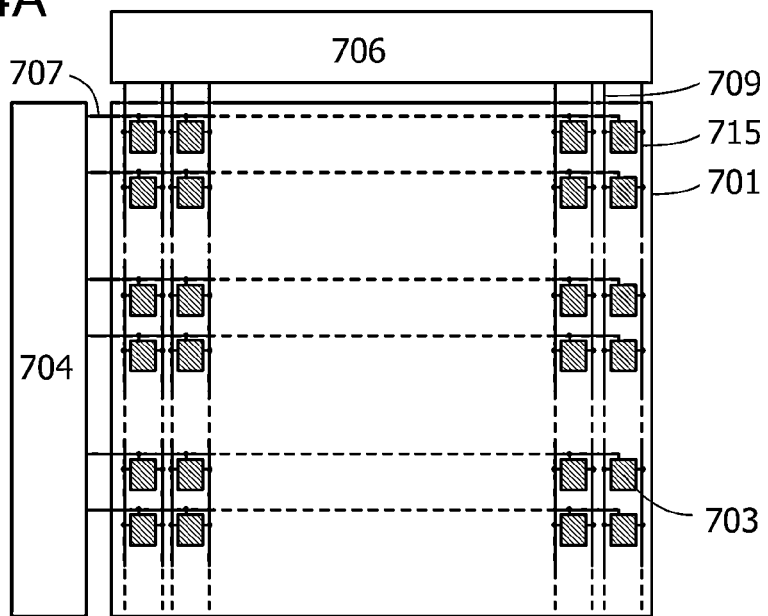
FIGS. 14A to 14C are a block diagram and circuit diagrams illustrating an example of a display device of one embodiment of the present invention.

FIG. 14A illustrates an example of the display device. The display device in FIG. 14A includes a pixel portion 701, a scan line driver circuit 704, a signal line driver circuit 706, m scan lines 707 which are arranged in parallel or substantially in parallel and whose potentials are controlled by the scan line driver circuit 704, and n signal lines 709 which are arranged in parallel or substantially in parallel and whose potentials are controlled by the signal line driver circuit 706. The pixel portion 701 includes a plurality of pixels 703 arranged in matrix. Capacitor lines 715 which are arranged in parallel or almost in parallel to the signal lines 709 are also provided. The capacitor lines 715 may be arranged in parallel or almost in parallel to the scan lines 707. Note that the scan line driver circuit 704 and the signal line driver circuit 706 are collectively referred to as a driver circuit portion in some cases.

Each scan line 707 is electrically connected to the n pixels 703 in the corresponding row among the pixels 703 arranged in m rows and n columns in the pixel portion 701. Each signal line 709 is electrically connected to the m pixels 703 in the corresponding column among the pixels 703 arranged in m rows and n columns. Note that m and n are natural numbers. Each capacitor line 715 is electrically connected to the n pixels 703 in the corresponding row among the pixels 703 arranged in m rows and n columns. Note that in the case where the capacitor lines 715 are arranged in parallel or substantially in parallel along the signal lines 709, each capacitor line 715 is electrically connected to the m pixels 703 in the corresponding column among the pixels 703 arranged in m rows and n columns.

Figure 14B:
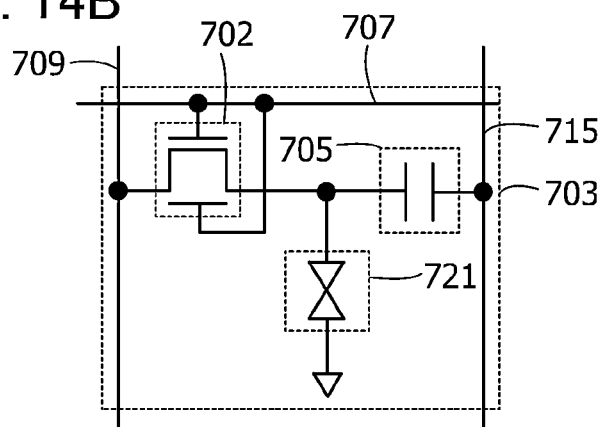
Figure 14C:
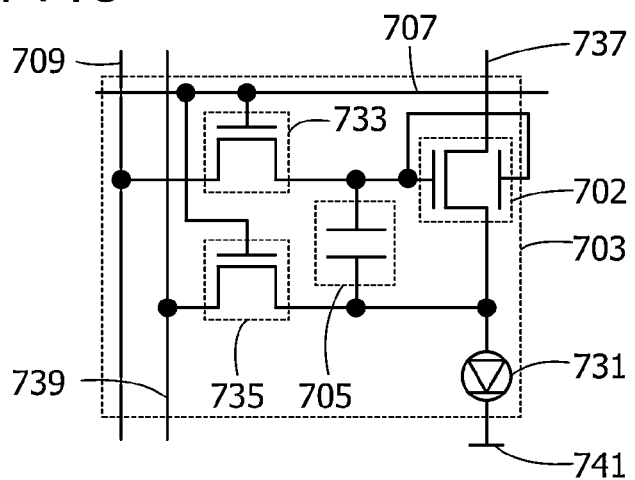

FIGS. 14B and 14C illustrate examples of circuit configurations that can be used for the pixels 703 in the display device illustrated in FIG. 14A.

The pixel 703 in FIG. 14B includes a liquid crystal element 721, a transistor 702, and a capacitor 705.

The potential of one of a pair of electrodes of the liquid crystal element 721 is set in accordance with the specifications of the pixel 703 as appropriate. The alignment state of the liquid crystal element 721 depends on written data. A common potential may be supplied to one of the pair of electrodes of the liquid crystal element 721 included in each of the plurality of pixels 703. Further, the potential supplied to one of a pair of electrodes of the liquid crystal element 721 in the pixel 703 in one row may be different from the potential supplied to one of a pair of electrodes of the liquid crystal element 721 in the pixel 703 in another row.

The liquid crystal element 721 is an element which controls transmission or non-transmission of light utilizing an optical modulation action of liquid crystal. The optical modulation action of a liquid crystal is controlled by an electric field applied to the liquid crystal (including a horizontal electric field, a vertical electric field, and an oblique electric field). Note that examples of the liquid crystal used for the liquid crystal element 721 include nematic liquid crystal, cholesteric liquid crystal, smectic liquid crystal, thermotropic liquid crystal, lyotropic liquid crystal, ferroelectric liquid crystal, and anti-ferroelectric liquid crystal.

Examples of a display mode which can be used for the display device including the liquid crystal element 721 include a TN mode, a VA mode, an axially symmetric aligned micro-cell (ASM) mode, an optically compensated birefringence (OCB) mode, an MVA mode, a patterned vertical alignment (PVA) mode, an IPS mode, an FFS mode, and a transverse bend alignment (TBA) mode. However, the display mode is not limited thereto.

A liquid crystal element including a liquid crystal composition including liquid crystal exhibiting a blue phase and a chiral material may be used. The liquid crystal exhibiting a blue phase has a short response time of 1 msec or less and is optically isotropic; therefore, alignment treatment is not necessary and the viewing angle dependence is small.

In the configuration of the pixel 703 in FIG. 14B, one of a source electrode and a drain electrode of the transistor 702 is electrically connected to the signal line 709, and the other thereof is electrically connected to the other of the pair of electrodes of the liquid crystal element 721. A gate of the transistor 702 is electrically connected to the scan line 707. The transistor 702 has a function of controlling whether to write a data signal by being turned on or off. Note that any of the transistors described above can be used as the transistor 702.

In the configuration of the pixel 703 in FIG. 14B, one of a pair of electrodes of the capacitor 705 is electrically connected to the capacitor line 715 supplied with potential, and the other thereof is electrically connected to the other of the pair of electrodes of the liquid crystal element 721. The potential of the capacitor line 715 is set in accordance with the specifications of the pixel 703 as appropriate. The capacitor 705 functions as a storage capacitor for holding written data.

For example, in the display device including the pixel 703 in FIG. 14B, the pixels 703 are sequentially selected row by row by the scan line driver circuit 704, whereby the transistors 702 are turned on and a data signal is written.

When the transistors 702 are turned off, the pixels 703 in which the data has been written are brought into a holding state. This operation is sequentially performed row by row; thus, an image is displayed.

The pixel 703 in FIG. 14C includes a transistor 733 which switches the display element, the transistor 702 which controls driving of the pixel, a transistor 735, the capacitor 705, and a light-emitting element 731.

One of a source electrode and a drain electrode of the transistor 733 is electrically connected to the signal line 709 supplied with a data signal. Furthermore, a gate electrode of the transistor 733 is electrically connected to a scan line 707 supplied with a gate signal.

The transistor 733 has a function of controlling whether to write a data signal by being turned on or off.

One of the source electrode and the drain electrode of the transistor 702 is electrically connected to a wiring 737 functioning as an anode line, and the other of the source electrode and the drain electrode of the transistor 702 is electrically connected to one of the electrodes of the light-emitting element 731. Furthermore, the gate electrode of the transistor 702 is electrically connected to the other of the source electrode and the drain electrode of the transistor 733 and one of the electrodes of the capacitor 705.

The transistor 702 has a function of controlling current flowing in the light-emitting element 731 by being turned on or off. Note that any of the transistors described above can be used as the transistor 702.

One of a source electrode and a drain electrode of the transistor 735 is connected to a wiring 739 supplied with a reference potential of data and the other of the source electrode and the drain electrode of the transistor 735 is electrically connected to the one of the electrodes of the light-emitting element 731 and the other of the electrodes of the capacitor 705. Furthermore, a gate electrode of the transistor 735 is electrically connected to the scan line 707 supplied with a gate signal.

The transistor 735 has a function of adjusting current flowing in the light-emitting element 731. For example, in the case where the inner resistance of the light-emitting element 731 is increased owing to deterioration of the light-emitting element 731 or the like, by monitoring current flowing in the wiring 739 to which the one of the source electrode and the drain electrode of the transistor 735 is connected, current flowing in the light-emitting element 731 can be corrected.

One of the pair of electrodes of the capacitor 705 is electrically connected to the other of the source electrode and the drain electrode of the transistor 733 and a gate electrode of the transistor 702. The other of the pair of electrodes of the capacitor 705 is electrically connected to the other of the source electrode and the drain electrode of the transistor 735 and the one of the electrodes of the light-emitting element 731.

In the configuration of the pixel 703 in FIG. 14C, the capacitor 705 functions as a storage capacitor which holds written data.

The one of the pair of electrodes of the light-emitting element 731 is electrically connected to the other of the source electrode and the drain electrode of the transistor 735, the other of the pair of electrodes of the capacitor 705, and the other of the source electrode and the drain electrode of the transistor 702. In addition, the other of the pair of electrodes of the light-emitting element 731 is electrically connected to a wiring 741 which functions as a cathode.

As the light-emitting element 731, an organic electroluminescent element (also referred to as an organic EL element) or the like can be used, for example. Note that the light-emitting element 731 is not limited to organic EL elements; an inorganic EL element including an inorganic material can be used.

A high power supply potential VDD is supplied to one of the wiring 737 and the wiring 741, and a low power supply potential VSS is supplied to the other thereof. In the configuration in FIG. 14C, the high power supply potential VDD is supplied to the wiring 737, and the low power supply potential VSS is supplied to the wiring 741.

In the display device including the pixel 703 in FIG. 14C, the pixels 703 are sequentially selected row by row by the scan line driver circuit 704, whereby the transistors 702 are turned on and a data signal is written.

When the transistors 733 are turned off, the pixels 733 in which the data has been written are brought into a holding state. The transistor 733 is connected to the capacitor 705; the written data can be held for a long time. The transistor 702 controls the amount of the current flowing between the source electrode and the drain electrode, and the light-emitting element 731 emits light with luminance in accordance with the amount of the flowing current. This operation is sequentially performed row by row; thus, an image is displayed.

Figure 15A:
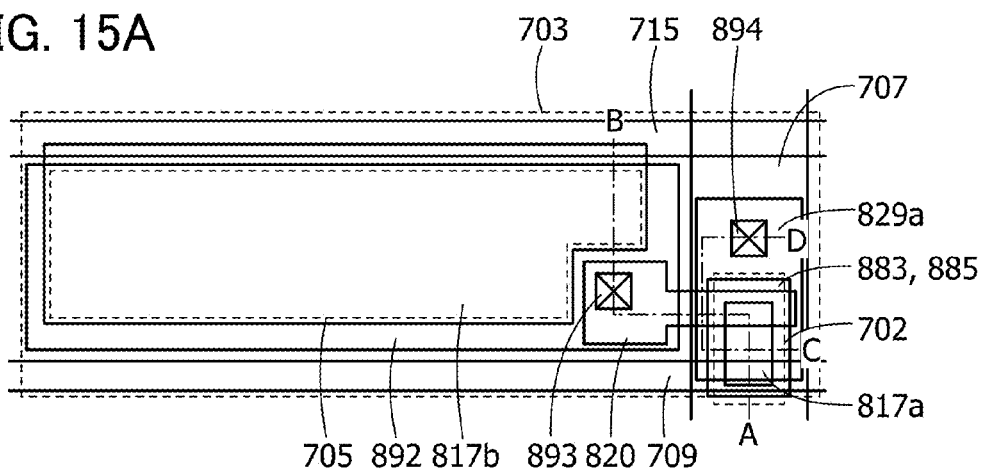
FIGS. 15A to 15C are a top view and cross-sectional views illustrating an example of a display device of one embodiment of the present invention.

Next, a specific configuration of an element substrate included in the display device is described. Here, a specific example of a liquid crystal display device including a liquid crystal element in the pixel 703 is described. FIG. 15A is a top view of the pixel 703 illustrated in FIG. 14B.

In the FIG. 15A, the scan line 707 extends in a direction substantially perpendicular to the signal line 709 (in the vertical direction in the figure). The signal line 709 extends in a direction substantially perpendicular to the scan line (in the horizontal direction in the figure). The capacitor line 715 extends in a direction parallel to the signal line. Note that the scan line 707 is electrically connected to the scan line driver circuit 704 (see FIG. 14A), and the signal line 709 and the capacitor line 715 are electrically connected to the signal line driver circuit 706 (see FIG. 14A).

The transistor 702 is provided in a region where the scan line 707 and the signal line 709 cross each other. The transistor 702 can have a structure similar to that of the transistor described above. Note that a region of the scan line 707 which overlaps an oxide semiconductor film 817*a* functions as the gate electrode of the transistor 702, which is represented as a gate electrode 813 in FIGS. 15B and 15C. Furthermore, a region of the signal line 709 which overlaps the oxide semiconductor film 817*a* functions as the source electrode or the drain electrode of the transistor 702, which is represented as an electrode 819 in FIG. 15B. Further, in FIG. 15A, an end portion of the scan line 707 is located on the outer side than an end portion of the oxide semiconductor film 817*a* when seen from the above. Thus, the scan line 707 functions as a light-blocking film for blocking light from a light source such as a backlight. For this reason, the oxide semiconductor film 817*a* included in the transistor is not irradiated with light, so that a variation in the electrical characteristics of the transistor can be suppressed.

An electrode 820 is connected to an electrode 892 in an opening 893. The electrode 892 is formed using a light-transmitting conductive film and functions as a pixel electrode.

The capacitor 705 is connected to the capacitor line 715. The capacitor 705 is formed using a conductive film 817*b* formed over a gate insulating film, a dielectric film provided over the transistor 702, and the electrode 892. The dielectric film is formed of a nitride insulating film. The conductive film 817*b*, the nitride insulating film, and the electrode 892 each have a light-transmitting property; therefore, the capacitor 705 has a light-transmitting property.

Owing to the light-transmitting property of the capacitor 705, the capacitor 705 can be formed large (covers a large area) in the pixel 703. Thus, a display device having an increased charge capacity as well as the aperture ratio increased (typically, 55% or more, preferably 60% or more) can be provided. For example, in a display device with a high resolution, as the area of a pixel becomes smaller, the area of a capacitor needs to be smaller. For this reason, the charge capacity which can be stored in the capacitor is small in the high-resolution display device. However, since the capacitor 705 of the above-described display device has a light-transmitting property, sufficient charge capacity can be obtained and the aperture ratio can be increased in each pixel. Typically, the capacitor 705 can be favorably used for a high-resolution display device with a pixel density of 200 pixels per inch (ppi) or more, 300 ppi or more, or further, 500 ppi or more.

Further, according to an embodiment of the present invention, the aperture ratio can be improved even in a display device with a high resolution, which makes it possible to use light from a light source such as a backlight efficiently, so that power consumption of the display device can be reduced.

Figure 15B:
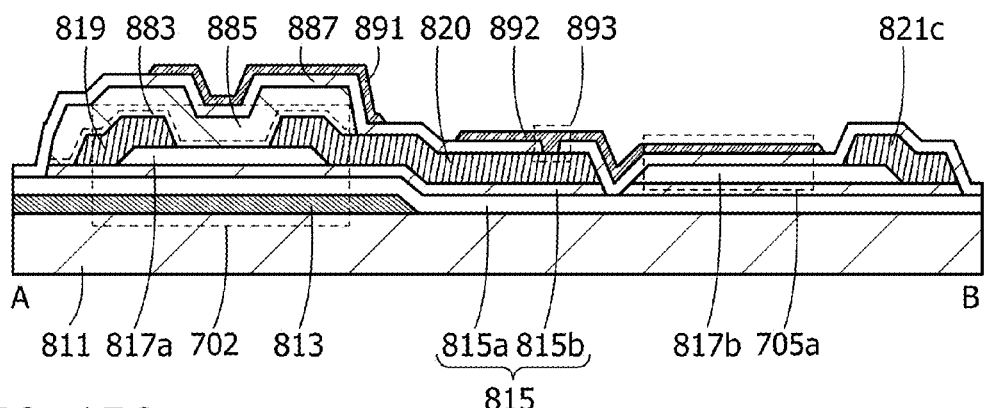
Figure 15C:
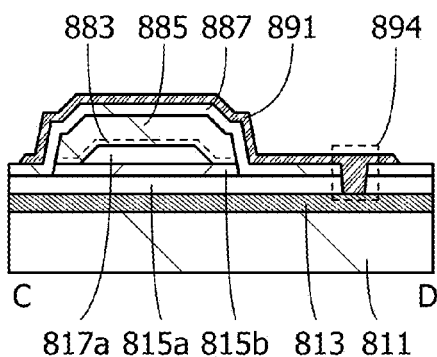

Next, cross-sectional views along dashed dotted lines A-B and C-D in FIG. 15A are illustrated in FIGS. 15B and 15C, respectively. Note that the cross-sectional view along the dashed dotted line A-B shows a cross section of the transistor 702 in the channel length direction, a cross section of a connection portion between the transistor 702 and the electrode 892 functioning as a pixel electrode, and a cross section of a capacitor 705a; the cross-sectional view along the dashed dotted line C-D shows a cross section of the transistor 702 in the channel width direction and a cross section of a connection portion between the gate electrode 813 and a gate electrode 891.

The transistor 702 illustrated in FIGS. 15B and 15C is a channel-etched transistor, including the gate electrode 813 provided over a substrate 811, a gate insulating film 815 formed over the substrate 811 and the gate electrode 813, the oxide semiconductor film 817a overlapping the gate electrode 813 with the gate insulating film 815 positioned therebetween, and the electrodes 819 and 820 in contact with the oxide semiconductor film 817a. Furthermore, an oxide insulating film 883 is formed over the gate insulating film 815, the oxide semiconductor film 817a, the electrode 819, and the electrode 820, and an oxide insulating film 885 is formed over the oxide insulating film 883. A nitride insulating film 887 is formed over the gate insulating film 815, the oxide insulating film 883, the oxide insulating film 885, and the electrode 820. The electrode 892 and the gate electrode 891 that are connected to one of the electrode 819 and the electrode 820 (here, the electrode 820) are formed over the nitride insulating film 887. Note that the electrode 892 functions as a pixel electrode.

The gate insulating film 815 is formed of a nitride insulating film 815a and an oxide insulating film 815b. The oxide insulating film 815b is provided so that the oxide semiconductor film 817a, the electrode 819, the electrode 820, and the oxide insulating film 883 are positioned over the oxide insulating film 815b.

As shown in the cross-sectional view along the line C-D, the gate electrode 891 is connected to the gate electrode 813 in an opening 894 provided in the nitride insulating film 815a and the nitride insulating film 887. That is, the gate electrode 813 has the same potential as the gate electrode 891.

The oxide insulating film 883 and the oxide insulating film 885 which are each separated for each transistor are formed over the transistor 702. The separated oxide insulating films 883 and 885 overlap the oxide semiconductor film 817a. In the cross-sectional view along the line C-D in the channel width direction, end portions of the oxide insulating film 883 and the oxide insulating film 885 are positioned on the outside of the oxide semiconductor film 817a. In the channel width direction, on the outside of each of one side surface and the other side surface of the oxide semiconductor film 817a, the gate electrode 891 faces the side surface of the oxide semiconductor film 817a with the oxide insulating film 883, the oxide insulating film 885, and the nitride insulating film 887 positioned therebetween. Furthermore, the nitride insulating film 887 is formed to cover the top surfaces and side surfaces of the oxide insulating film 883 and the oxide insulating film 885 and in contact with the nitride insulating film 815a.

In the transistor 702, the oxide semiconductor film 817a and the oxide insulating film 885 are provided on the inside of the nitride insulating film 815a and the nitride insulating film 887, and the nitride insulating film 815a and the nitride insulating film 887 are in contact with each other. The nitride insulating film 815a and the nitride insulating film 887 have a small oxygen diffusion coefficient and have a barrier property against oxygen; therefore, part of oxygen included in the oxide insulating film 885 can be moved to the oxide semiconductor film 817a, so that the amount of oxygen vacancy of the oxide semiconductor film 817a can be reduced. In addition, the nitride insulating film 815a and the nitride insulating film 887 have a barrier property against water, hydrogen, and the like; therefore, water, hydrogen, and the like can be prevented from entering the oxide semiconductor film 817a from the outside. As a result, the transistor 702 becomes a highly reliable transistor.

The capacitor 705a includes the conductive film 817b formed over the gate insulating film 815, the nitride insulating film 887, and the electrode 892. The conductive film 817b in the capacitor 705a is formed at the same time as the oxide semiconductor film 817a and has increased conductivity by containing an impurity. Alternatively, the conductive film 817b is formed at the same time as the oxide semiconductor film 817a and has increased conductivity by containing an impurity and including oxygen vacancy which is generated owing to plasma damage.

The oxide semiconductor film 817a and the conductive film 817b are formed over the gate insulating film 815 and have different impurity concentrations. Specifically, the conductive film 817b has a higher impurity concentration than the oxide semiconductor film 817a. For example, the concentration of hydrogen contained in the oxide semiconductor film 817a is lower than $5 \times 10^{19}$ atoms/cm$^3$, preferably lower than $5 \times 10^{18}$ atoms/cm$^3$, more preferably lower than or equal to $1 \times 10^{18}$ atoms/cm$^3$, further preferably lower than or equal to $5 \times 10^{17}$ atoms/cm$^3$, still further preferably lower than or equal to $1 \times 10^{16}$ atoms/cm$^3$. The concentration of hydrogen contained in the conductive film 817b is higher than or equal to $8 \times 10^{19}$ atoms/cm$^3$, preferably higher than or equal to $1 \times 10^{20}$ atoms/cm$^3$, further preferably higher than or equal to $5 \times 10^{20}$ atoms/cm$^3$. The concentration of hydrogen contained in the conductive film 817b is greater than or equal to 2 times, preferably greater than or equal to 10 times that in the oxide semiconductor film 817a.

The conductive film 817b has lower resistivity than the oxide semiconductor film 817a. The resistivity of the conductive film 817b c is preferably greater than or equal to $1 \times 10^{-8}$ times and less than $1 \times 10^{-1}$ times the resistivity of the oxide semiconductor film 817a. The resistivity of the conductive film 817b is typically greater than or equal to $1 \times 10^{-3}$ Ωcm and less than $1 \times 10^{4}$ Ωcm, preferably greater than or equal to $1 \times 10^{-3}$ Ωcm and less than $1 \times 10^{-1}$ Ωcm.

For example, the conductive film 817b may be formed by plasma damage at the time of forming the nitride insulating film 887 formed over the conductive film 817b. Note that the nitride insulating film 887 has a high hydrogen concentration; therefore, the hydrogen concentration of the conductive film 817b is increased by being subjected to plasma damage. When hydrogen enters the oxide semiconductor film or hydrogen enters a site of oxygen vacancy, carriers might be generated in the oxide semiconductor film. Therefore, the carrier density of the oxide semiconductor film can be increased owing to the function of the nitride insulating film 887, and thus the conductive film 817b can be formed in some cases.

One electrode of the capacitor is formed at the same time as the oxide semiconductor film of the transistor. In addition, the conductive film that serves as a pixel electrode is used as the other electrode of the capacitor. Thus, a step of forming another conductive film is not needed to form the capacitor, and the number of manufacturing steps can be reduced. Further, since the pair of electrodes has a light-transmitting property, the capacitor has a light-transmitting property. As a result, the area occupied by the capacitor can be increased and the aperture ratio in a pixel can be increased.

In the above manner, a display device having excellent display performance can be obtained.

<Memory 1>

In the description below, a circuit configuration and operation of a memory cell that is a semiconductor memory device including the above transistor are described with reference to FIGS. 16A and 16B.

Note that the semiconductor memory device may include a driver circuit, a power supply circuit, or the like provided over another substrate, in addition to the memory cell.

Figure 16A:
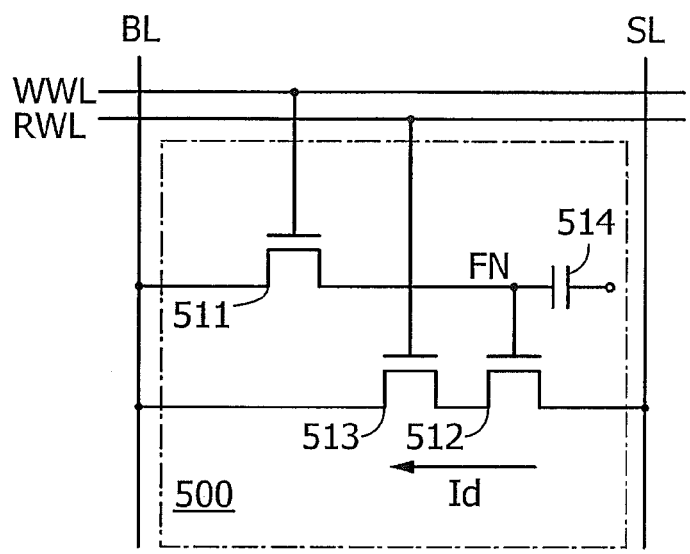
FIGS. 16A and 16B are a circuit diagram and a timing chart illustrating an example of a semiconductor memory device of one embodiment of the present invention.

FIG. 16A is a circuit diagram showing an example of a memory cell 500.

The memory cell 500 shown in FIG. 16A includes a transistor 511, a transistor 512, a transistor 513, and a capacitor 514. Note that in the actual case, a plurality of memory cells 500 is arranged in a matrix, though not shown in FIG. 16A.

A gate of the transistor 511 is connected to a write word line WWL. One of a source and a drain of the transistor 511 is connected to a bit line BL. The other of the source and the drain of the transistor 511 is connected to a floating node FN.

A gate of the transistor 512 is connected to the floating node FN. One of a source and a drain of the transistor 512 is connected to one of a source and a drain of the transistor 513. The other of the source and the drain of the transistor 512 is connected to a power supply line SL.

A gate of the transistor 513 is connected to a read word line RWL. The other of the source and the drain of the transistor 513 is connected to the bit line BL.

One electrode of the capacitor 514 is connected to the floating node FN. The other electrode of the capacitor 514 is supplied with a constant potential.

A word signal is supplied to the write word line WWL.

The word signal is a signal which turns on the transistor 511 so that the voltage of the bit line BL is supplied to the floating node FN.

Note that "writing of data to the memory cell" means that a word signal supplied to the write word line WWL is controlled so that the potential of the floating node FN reaches a potential corresponding to the voltage of the bit line BL. Further, "reading of data from the memory cell" means that a read signal supplied to the read word line RWL is controlled so that the voltage of the bit line BL reaches a voltage corresponding to the potential of the floating node FN.

Multilevel data is supplied to the bit line BL. Further, a discharge voltage $V_{discharge}$ for reading data is supplied to the bit line BL.

The multilevel data is k-bit (k is an integer of 2 or more) data. Specifically, 2-bit data is 4-level data, namely, a signal having any one of the four levels of voltages.

The discharge voltage $V_{discharge}$ is a voltage which is supplied to the bit line BL to perform reading of data. After the discharge voltage $V_{discharge}$ is supplied, the bit line BL is brought into an electrically floating state. The discharge voltage $V_{discharge}$ is a voltage which is supplied to initialize the bit line BL.

A read signal is supplied to the read word line RWL.

The read signal is a signal which is supplied to the gate of the transistor 513 to perform reading of data from the memory cell in a selective manner.

The floating node FN corresponds to any node on a wiring which connects one electrode of the capacitor 514, the other of the source and the drain of the transistor 511, and the gate of the transistor 512.

Note that the potential of the floating node FN is based on the multilevel data supplied to the bit line BL. The floating node FN is in an electrically floating state when the transistor 511 is turned off.

The power supply line SL is supplied with a precharge voltage $V_{precharge}$ which is higher than a discharge voltage $V_{discharge}$ supplied to the bit line BL.

Note that the voltage of the power supply line SL needs to be the precharge voltage $V_{precharge}$ at least in a period in which data is read from the memory cell 500. Thus, in a period in which data is written to the memory cell 500 and/or in a period in which data is not read or written, the power supply line SL can be supplied with the discharge voltage $V_{discharge}$, so that the bit line BL and the power supply line SL have the same potential. With such a structure, a slight amount of through current that flows between the bit line BL and the power supply line SL can be reduced.

As another structure, the power supply line SL may be supplied with a constant voltage that is equal to the precharge voltage $V_{precharge}$. With such a structure, it is not necessary to switch the voltage of the power supply line SL between the precharge voltage $V_{precharge}$ and the discharge voltage $V_{discharge}$, and thus, power consumed in charging and discharging of the potential of the power supply line SL can be reduced.

The precharge voltage $V_{precharge}$ is supplied to the power supply line SL to change the discharge voltage $V_{discharge}$ supplied to the bit line BL by charging via the transistor 512 and the transistor 513.

The transistor 511 has a function of a switch for controlling writing of data by being switched between a conducting state and a non-conducting state. The transistor 511 also has a function of holding a potential based on written data by keeping a non-conducting state. Note that the transistor 511 is an n-channel transistor in the description.

As the transistor 511, a transistor having a low current (low off-state current) which flows between the source and the drain in a non-conducting state is preferably used.

In the configuration of the memory cell 500 shown in FIG. 16A, a potential based on written data is held by keeping the non-conducting state. Thus, it is particularly preferable to use a transistor with a low off-state current as a switch for suppressing change in the potential in the floating node FN which is accompanied by the transfer of electrical charge. Note that a method for estimating the off-state current of a transistor with low off-state current is described later.

When a transistor having a low off-state current is used as the transistor 511 and the memory cell 500 is kept turned off, the memory cell 500 can be a non-volatile memory. Thus, once data is written to the memory cell 500, the data can be held in the floating node FN until the transistor 511 is turned on again.

In the transistor 512, a drain current $I_d$ flows between the source and the drain in accordance with the potential of the floating node FN. Note that in the memory cell 500 shown in FIG. 16A, the drain current $I_d$ that flows between the source and the drain of the transistor 512 is a current that flows between the bit line BL and the power supply line SL. Note that the transistor 512 is also referred to as a second transistor. Note that the transistor 512 is an n-channel transistor in the description.

In the transistor 513, the drain current $I_d$ flows between the source and the drain in accordance with the potential of the read word line RWL. Note that in the memory cell 500 shown in FIG. 16A, the drain current $I_d$ that flows between the source and the drain of the transistor 513 is a current that flows between the bit line BL and the power supply line SL. Note that the transistor 513 is also referred to as a third transistor. Note that the transistor 513 is an n-channel transistor in the description.

The transistor 512 and the transistor 513 preferably have small variation in threshold voltage. Here, transistors with small variation in threshold voltage mean transistors that are produced in the same process and have an acceptable difference in threshold voltage of 20 mV or lower; a specific example of the transistors is transistors formed using single crystal silicon in channels. It is needless to say that the variation in threshold voltage is preferably as small as possible; however, even the transistors including single crystal silicon may have a difference in threshold voltage of approximately 20 mV.

Next, operation of the memory cell 500 illustrated in FIG. 16A is described.

Figure 16B:
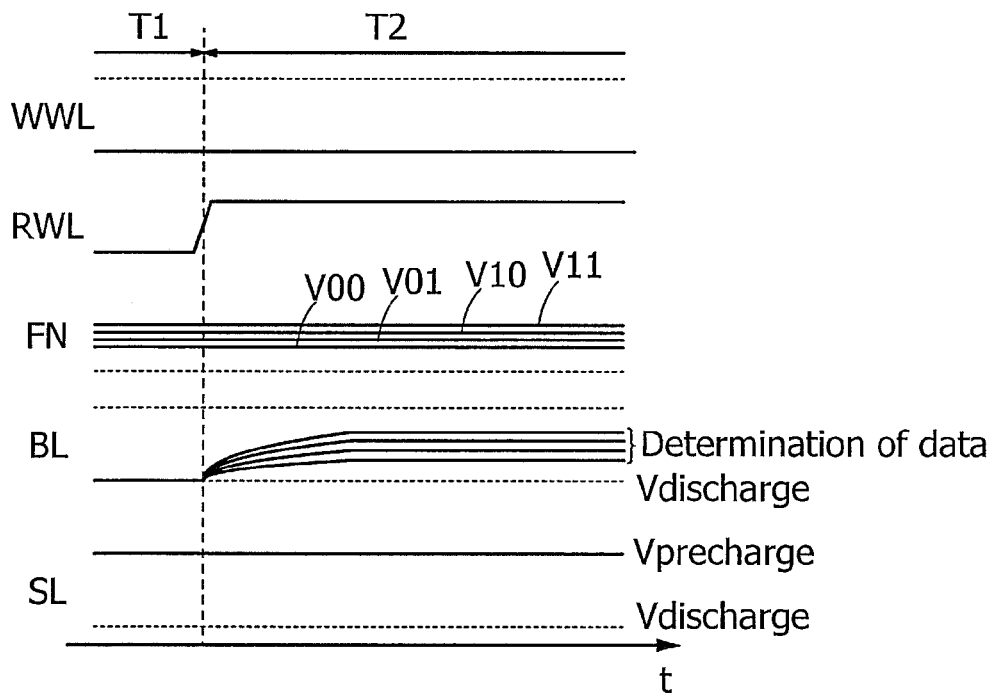

FIG. 16B is a timing chart illustrating change of signals supplied to the write word line WWL, the read word line RWL, the floating node FN, the bit line BL, and the power supply line SL which are shown in FIG. 16A.

The following periods are shown in the timing chart of FIG. 16B: a period T1 which is in an initial state; and a period T2 in which the potential of the bit line BL is charged to perform reading of data.

In the period T1 of FIG. 16B, the electric charge of the bit line BL is discharged. At this time, the write word line WWL is supplied with a low-level potential. The read word line RWL is supplied with the low-level potential. The floating node FN holds a potential corresponding to the multilevel data. The bit line BL is supplied with a discharge voltage $V_{discharge}$. The power supply line SL is supplied with a precharge voltage $V_{precharge}$.

Note that as an example of the multilevel data, 2-bit data, i.e., 4-level data is shown in FIG. 16B. Specifically, 4-level data ($V_{00}$, $V_{01}$, $V_{10}$, and $V_{11}$) are shown in FIG. 16B, and the data can be represented by four levels of potentials.

The bit line BL is brought into an electrically floating state after the discharge voltage $V_{discharge}$ is supplied. That is, the bit line BL is brought into a state in which the potential is changed by the charging or discharging of electrical charge. The floating state can be achieved by turning off a switch for supplying a potential to the bit line BL.

Next, in the period T2 of FIG. 16B, the potential of the bit line BL is charged to perform reading of data. At this time, the write word line WWL is supplied with the low-level potential as in the previous period. The read word line RWL is supplied with a high-level potential. In the floating node FN, the potential corresponding to the multilevel data is held as in the previous period. In the bit line BL, the discharge voltage $V_{discharge}$ is increased in accordance with the potential of the floating node FN. The power supply line SL is supplied with the precharge voltage $V_{precharge}$ as in the previous period.

The transistor 513 is turned on in accordance with the change in the potential of the read word line RWL. Thus, the potential of one of the source and the drain of the transistor 512 is lowered to be the discharge voltage $V_{discharge}$.

The transistor 512 is an n-channel transistor. When the potential of one of the source and the drain of the transistor 512 is lowered to be the discharge voltage $V_{discharge}$, the absolute value of a voltage between the gate and the source (gate voltage) is increased. With the increase in the gate voltage, the drain current $I_d$ flows between the source and the drain of each of the transistors 512 and 513.

When the drain current $I_d$ flows in each of the transistor 512 and the transistor 513, the electrical charge of the power supply line SL is stored to the bit line BL. The potential of the source of the transistor 512 and the potential of the bit line BL are raised by the charging. The raising of the potential in the source of the transistor 512 leads to a gradual decrease in gate voltage of the transistor 512.

When gate voltage reaches the threshold voltage of the transistor 512, the drain current $I_d$ that flows in the period T2 stops flowing. Therefore, the raising of the potential in the bit line BL proceeds, and when the gate voltage of the transistor 512 reaches the threshold voltage, the charging is completed and the bit line BL has a constant potential. The potential of the bit line BL at this time is approximately a difference between the potential of the floating node FN and the threshold voltage.

That is, the potential of the floating node FN can be reflected in the potential of the bit line BL which is changed by the charging. The difference in the potential is used to determine the multilevel data. In this manner, the multilevel data written to the memory cell 500 can be read.

Accordingly, the multilevel data can be read from the memory cell without switching a signal for reading data in accordance with the number of levels of the multilevel data.

<Memory 2>

Figure 17A:
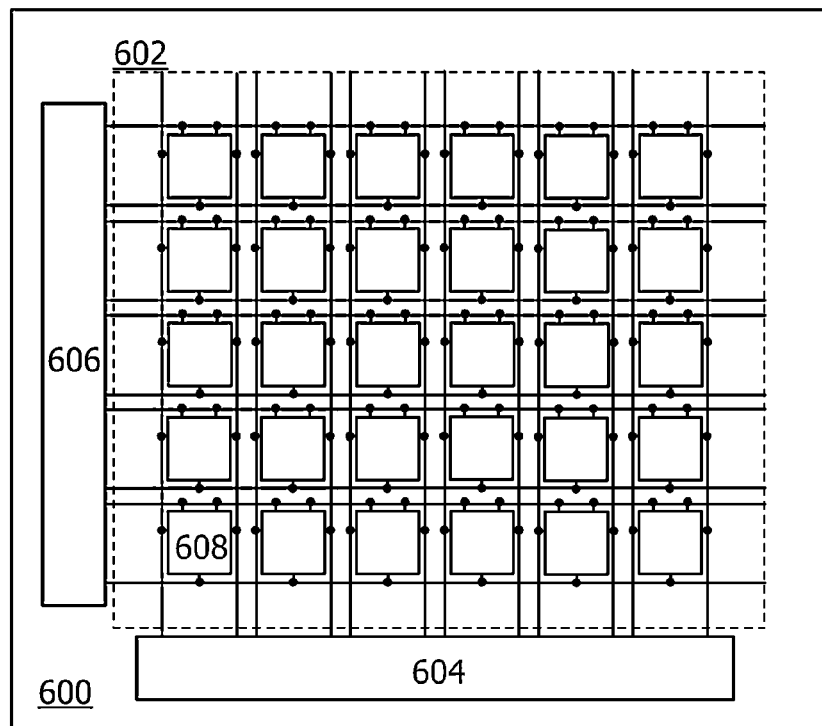
FIGS. 17A and 17B are a block diagram and a circuit diagram illustrating an example of a semiconductor memory device of one embodiment of the present invention.

A circuit configuration of a semiconductor memory device that is different from that of Memory 1 and operation of the semiconductor memory device are described with reference to FIGS. 17A and 17B As the semiconductor memory device that is one embodiment of the present invention, a storage device 600 is illustrated in FIG. 17A. The memory device 600 illustrated in FIG. 17A includes a memory element portion 602, a first driver circuit 604, and a second driver circuit 606.

A plurality of memory elements 608 are arranged in matrix in the memory element portion 602. In the example illustrated in FIG. 17A, the memory elements 608 are arranged in five rows and six columns in the memory element portion 602.

The first driver circuit 604 and the second driver circuit 606 control supply of signals to the memory elements 608, and obtain signals from the memory elements 608 in reading. For example, the first driver circuit 604 serves as a word line driver circuit and the second driver circuit 606 serves as a bit line driver circuit. Note that one embodiment of the present invention is not limited thereto, and the first driver circuit 604 and the second driver circuit 606 may serve as a bit line driver circuit and a word line driver circuit, respectively.

The first driver circuit 604 and the second driver circuit 606 are each electrically connected to the memory elements 608 by wirings.

The memory elements 608 each include a volatile memory and a non-volatile memory. FIG. 17B illustrates a specific example of a circuit configuration of the memory element 608. The memory element 608 illustrated in FIG. 17B includes a first memory circuit 610 and a second memory circuit 612.

The first memory circuit 610 includes a first transistor 614, a second transistor 616, a third transistor 618, a fourth transistor 620, a fifth transistor 622, and a sixth transistor 624.

First, a configuration of the first memory circuit 610 is described. One of a source and a drain of the first transistor 614 is electrically connected to a first terminal 630, and a gate of the first transistor 614 is electrically connected to a second terminal 632. One of a source and a drain of the second transistor 616 is electrically connected to a high potential power supply line Vdd. The other of the source and the drain of the second transistor 616 is electrically connected to the other of the source and the drain of the first transistor 614, one of a source and a drain of the third transistor 618, and a first data holding portion 640. The other of the source and the drain of the third transistor 618 is electrically connected to a low potential power supply line Vss. A gate of the second transistor 616 and a gate of the third transistor 618 are electrically connected to a second data storage portion 642.

One of a source and a drain of the fourth transistor 620 is electrically connected to a third terminal 634. A gate of the fourth transistor 620 is electrically connected to a fourth terminal 636. One of a source and a drain of the fifth transistor 622 is electrically connected to the high potential power supply line Vdd. The other of the source and the drain of the fifth transistor 622 is electrically connected to the other of the source and the drain of the fourth transistor 620, one of a source and a drain of the sixth transistor 624, and the second data holding portion 642. The other of the source and the drain of the sixth transistor 624 is electrically connected to the low potential power supply line Vss. A gate of the fifth transistor 622 and a gate of the sixth transistor 624 are electrically connected to the first data holding portion 640.

The first transistor 614, the third transistor 618, the fourth transistor 620, and the sixth transistor 624 are n-channel transistors.

The second transistor 616 and the fifth transistor 622 are p-channel transistors.

The first terminal 630 is electrically connected to a bit line. The second terminal 632 is electrically connected to a first word line. The third terminal 634 is electrically connected to an inverted bit line. The fourth terminal 636 is electrically connected to the first word line.

The first memory circuit 610 having the above-described configuration is an SRAM. In other words, the first memory circuit 610 is a volatile memory. In the memory device 600, which is one embodiment of the present invention, the first data holding portion 640 and the second data holding portion 642, which are provided in the first memory circuit 610, are electrically connected to the second memory circuit 612.

The second memory circuit 612 includes a seventh transistor 626 and an eighth transistor 628.

Next, a configuration of the second memory circuit 612 is described. One of a source and a drain of the seventh transistor 626 is electrically connected to the second data holding portion 642. The other of the source and the drain of the seventh transistor 626 is electrically connected to one electrode of a first capacitor 648. The other electrode of the first capacitor 648 is electrically connected to the low potential power supply line Vss. One of a source and a drain of the eighth transistor 628 is electrically connected to the first data holding portion 640. The other of the source and the drain of the eighth transistor 628 is electrically connected to one electrode of a second capacitor 650. The other electrode of the second capacitor 650 is electrically connected to the low potential power supply line Vss. A gate of the seventh transistor 626 and a gate of the eighth transistor 628 are electrically connected to a fifth terminal 638.

The fifth terminal 638 is electrically connected to a second word line. Note that a signal of one of the first word line and the second word line may be controlled by the operation of the other, or alternatively, they may be controlled independently from each other.

The seventh transistor 626 and the eighth transistor 628 are each a transistor having low off-state current. In the configuration illustrated in FIG. 17B, the seventh transistor 626 and the eighth transistor 628 are n-channel transistors; however, one embodiment of the present invention is not limited thereto.

A third data storage portion 644 is formed between the seventh transistor 626 and the one electrode of the first capacitor 648. A fourth data holding portion 646 is formed between the eighth transistor 628 and the one electrode of the second capacitor 650. Since the seventh transistor 626 and the eighth transistor 628 each have low off-state current, charge in the third data holding portion 644 and the fourth data holding portion 646 can be held for a long period. In other words, the second memory circuit 612 is a non-volatile memory.

The seventh transistor 626 and the eighth transistor 628 are each a transistor having low off-state current.

As described above, the first memory circuit 610 is a volatile memory and the second memory circuit 612 is a non-volatile memory. The first data storage portion 640 and the second data storage portion 642, which are the data storage portions in the first memory circuit 610, are electrically connected to the third data storage portion 644 and the fourth data storage portion 646, which are the data storage portions in the second memory circuit 612, through the transistors each having low off-state current. Thus, by controlling the gate potentials of the transistors each having low off-state current, the data in the first memory circuit 610 can be stored also in the data holding portion of the second memory circuit 612. Moreover, the use of the transistors each having a low off-state current enables stored data to be held in the third data holding portion 644 and the fourth data holding portion 646 for a long period even when power is not supplied to the storage element 608.

Figure 17B:
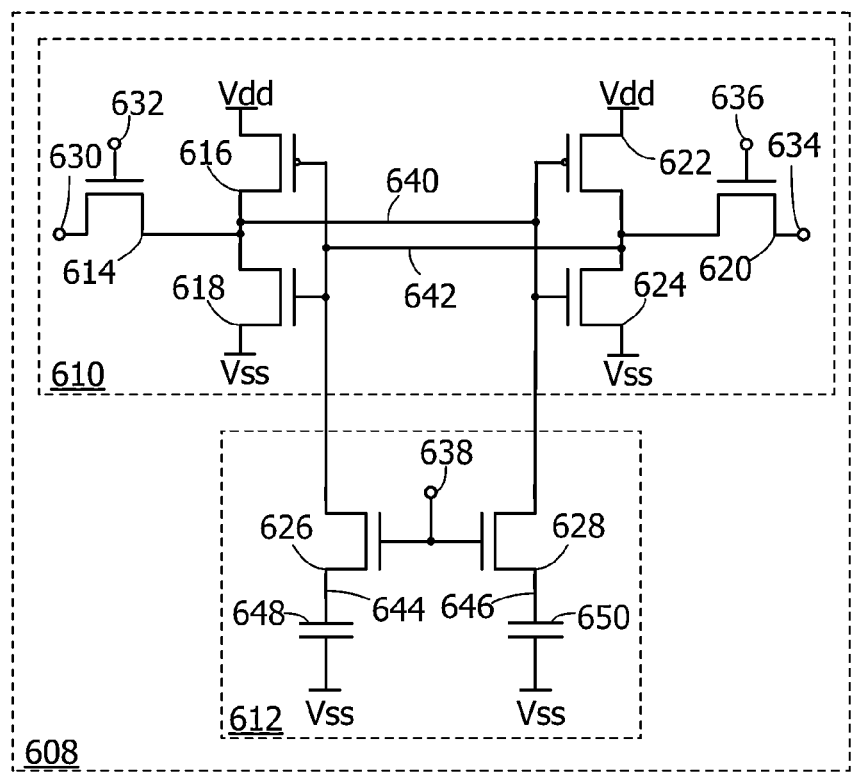

In this way, in the memory element 608 illustrated in FIG. 17B, data in the volatile memory can be stored in the non-volatile memory.

The first memory circuit 610 is an SRAM, and thus needs to operate at high speed. On the other hand, the second memory circuit 612 is required to hold data for a long period after supply of power is stopped. Such requirements can be satisfied by forming the first memory circuit 610 using transistors which are capable of high speed operation and forming the second memory circuit 612 using transistors which have low off-state current. For example, the first memory circuit 610 may be formed using transistors each formed using silicon, and the second memory circuit 612 may be formed using transistors each formed using an oxide semiconductor film.

In the memory device 600, which is one embodiment of the present invention, when the first transistor 614 and the fourth transistor 620 are turned on so that data is written to the data holding portions in the first memory circuit 610, which is a volatile memory, in the case where the seventh transistor 626 and the eighth transistor 628, which are included in the second memory circuit 612, are on, it is necessary to accumulate charge in the first capacitor 648 and the second capacitor 650, which are included in the second memory circuit 612, in order that the data holding portions (the first data holding portion 640 and the second data holding portion 642) in the first memory circuit 610 each hold a predetermined potential. Therefore, the seventh transistor 626 and the eighth transistor 628 which are on when data is written to the data holding portions in the first memory circuit 610 prevent the memory element 608 from operating at high speed. In a case of the second memory circuit 612 formed using a single crystal silicon substrate, it is difficult to sufficiently reduce the off-state current and hold stored data in second memory circuit 612 for a long period.

Thus, in the semiconductor memory device that is one embodiment of the present invention, when data is written to the data holding portions in the first memory circuit 610 (the volatile memory), transistors (i.e., the seventh transistor 626 and the eighth transistor 628) which are positioned between the data holding portions in the first memory circuit 610 and the data holding portions in the second memory circuit 612 are turned off. In this manner, high speed operation of the memory element 608 can be achieved. Furthermore, when neither writing nor reading to/from the data holding portions in the first memory circuit 610 is performed (that is, the first transistor 614 and the fourth transistor 620 are off), the transistors which are positioned between the data holding portions in the first memory circuit 610 and the data holding portions in the second memory circuit 612 are turned on.

A specific operation of data writing to the volatile memory in the memory element 608 is described below. First, the seventh transistor 626 and the eighth transistor 628 which are on are turned off. Next, the first transistor 614 and the fourth transistor 620 are turned on to supply a predetermined potential to the data holding portions (the first data holding portion 640 and the second data holding portion 642) in the first memory circuit 610, and then the first transistor 614 and the fourth transistor 620 are turned off. After that, the seventh transistor 626 and the eighth transistor 628 are turned on. In this manner, data corresponding to data held in the data holding portions in the first memory circuit 610 is held in the data holding portions in the second memory circuit 612.

When the first transistor 614 and the fourth transistor 620 are turned on at least for data writing to the data holding portions in the first memory circuit 610, it is necessary to turn off the seventh transistor 626 and the eighth transistor 628, which are included in the second memory circuit 612. Note that the seventh transistor 626 and the eighth transistor 628, which are included in the second memory circuit 612, may be either on or off when the first transistor 614 and the fourth transistor 620 are turned on for data reading from the data holding portions in the first memory circuit 610.

In the case where supply of power to the storage element 608 is stopped, the transistors positioned between the data holding portions in the first memory circuit 610 and the data holding portions in the second memory circuit 612 (i.e., the seventh transistor 626 and the eighth transistor 628) are turned off just before supply of power to the storage element 608 is stopped, so that the data held in the second memory circuit 612 becomes non-volatile. A means for turning off the seventh transistor 626 and the eighth transistor 628 just before supply of power to the volatile memory is stopped may be mounted on the first driver circuit 604 and the second driver circuit 606, or may alternatively be provided in another control circuit for controlling these driver circuits.

Note that here, whether the seventh transistor 626 and the eighth transistor 628, which are positioned between the data holding portions in the first memory circuit 610 and the data holding portions in the second memory circuit 612, are turned on or off may be determined in each storage element or may be determined in each block in the case where the storage element portion 602 is divided into blocks.

When the first memory circuit 610 operates as an SRAM, the transistors which are positioned between the data holding portions in the first memory circuit 610 and the data holding portions in the second memory circuit 612 are turned off; accordingly, data can be stored in the first memory circuit 610 without accumulation of electrical charge in the first capacitor 648 and the second capacitor 650, which are included in the second memory circuit 612. Thus, the storage element 608 can operate at high speed.

In the storage device 600 of one embodiment of the present invention, before supply of power to the storage device 600 is stopped (a power source of the storage device 600 is turned off), only the transistors which are positioned between the data holding portions in the first memory circuit 610 and the data holding portions in the second memory circuit 612 in the storage element 608 to which data has been rewritten lastly may be turned on. In that case, an address of the storage element 608 to which data has been rewritten lastly is preferably stored in an external memory, in which case the data can be stored smoothly.

Note that the driving method of the semiconductor memory device that is one embodiment of the present invention is not limited to the above description.

As described above, the memory device 600 can operate at high speed. Since data storing is performed only by part of the memory elements, power consumption can be reduced.

Here, an SRAM is used for the volatile memory; however, one embodiment of the present invention is not limited thereto, and other volatile memories may be used.

<CPU>

Figure 18A:
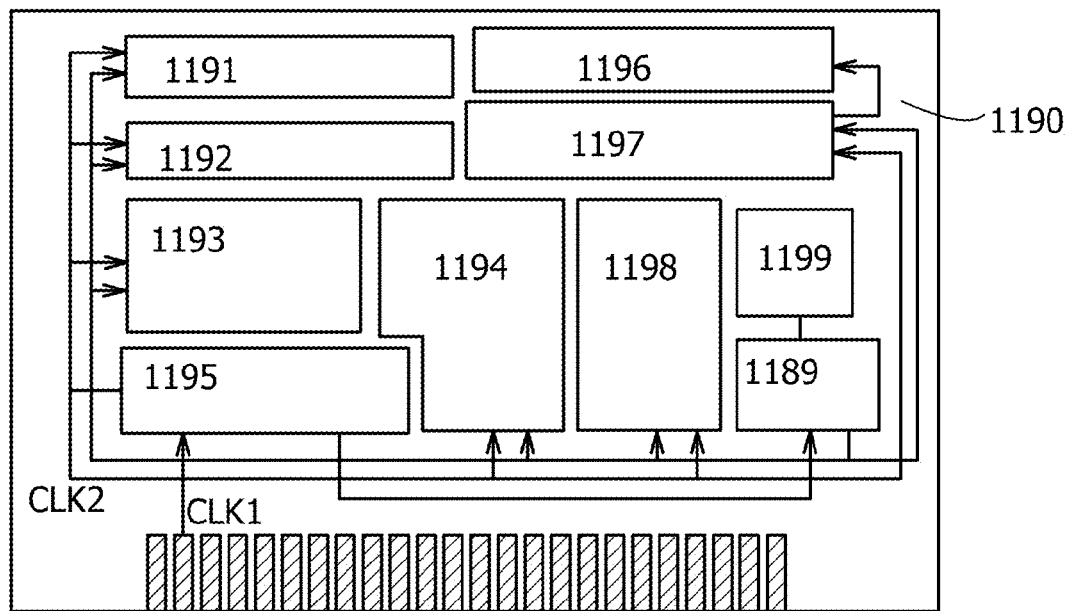
FIGS. 18A to 18C are block diagrams illustrating examples of a CPU of one embodiment of the present invention.
Figure 18B:
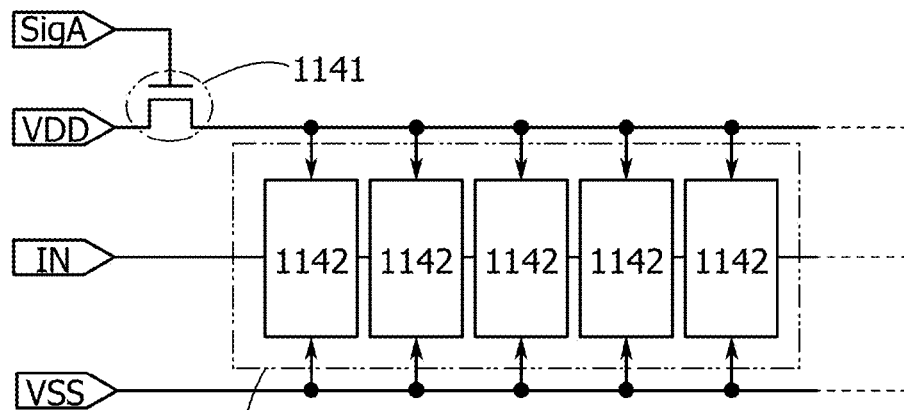
Figure 18C:
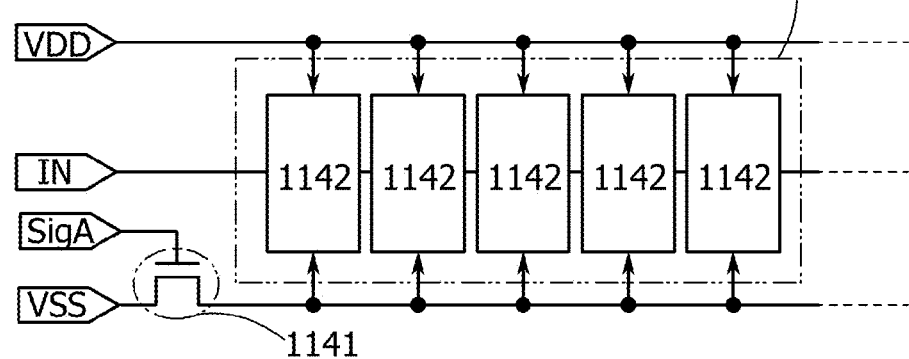

FIGS. 18A to 18C are block diagrams illustrating a specific configuration of a CPU at least partly including the above transistor or semiconductor memory device.

The CPU illustrated in FIG. 18A includes an arithmetic logic unit (ALU) 1191, an ALU controller 1192, an instruction decoder 1193, an interrupt controller 1194, a timing controller 1195, a register 1196, a register controller 1197, a bus interface 1198 (BUS I/F), a rewritable ROM 1199, and an ROM interface (ROM I/F) 1189 over a substrate 1190. A semiconductor substrate, an SOI substrate, a glass substrate, or the like is used as the substrate 1190. The ROM 1199 and the ROM interface 1189 may be provided over a separate chip. Obviously, the CPU shown in FIG. 18A is just an example in which the structure is simplified, and an actual CPU may have various structures depending on the application.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 processes an interrupt request from an external input/output device or a peripheral circuit depending on its priority or a mask state. The register controller 1197 generates an address of the register 1196, and reads/writes data from/to the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal CLK2 on the basis of a reference clock signal CLK1, and supplies the internal clock signal CLK2 to the above circuits.

In the CPU illustrated in FIG. 18A, a memory cell is provided in the register 1196. As the memory cell of the register 1196, the above-described transistor can be used.

In the CPU illustrated in FIG. 18A, the register controller 1197 selects an operation of holding data in the register 1196 in accordance with an instruction from the ALU 1191. That is, the register controller 1197 selects whether data is held by a flip-flop or by a capacitor in the memory cell included in the register 1196. When data holding by the flip-flop is selected, a power supply voltage is supplied to the memory cell in the register 1196. When data holding by the capacitor is selected, the data is rewritten in the capacitor, and supply of power supply voltage to the memory cell in the register 1196 can be stopped.

The power supply can be stopped by providing a switching element between a memory cell group and a node to which a high power supply potential VDD or a low power supply potential VSS is supplied, as illustrated in FIG. 18B or FIG. 18C. Circuits illustrated in FIGS. 18B and 18C will be described below.

FIGS. 18B and 18C are each a memory device in which the above transistor is used as a switching element for controlling power supply potential supplied to memory cells.

The memory device illustrated in FIG. 18B includes a switching element 1141 and a memory cell group 1143 including a plurality of memory cells 1142. Specifically, as each of the memory cells 1142, the above transistor can be used. Each of the memory cells 1142 included in the memory cell group 1143 is supplied with the high power supply potential VDD via the switching element 1141. Further, each of the memory cells 1142 included in the memory cell group 1143 is supplied with a potential of a signal IN and the low power supply potential VSS.

In FIG. 18B, any of the above transistors is used as the switching element 1141, and the switching of the transistor is controlled by a signal SigA supplied to a gate electrode layer thereof.

Note that FIG. 18B illustrates the structure in which the switching element 1141 includes only one transistor; however, without particular limitation thereon, the switching element 1141 may include a plurality of transistors. The switching element 1141 may include a plurality of transistors. In the case where the switching element 1141 includes a plurality of transistors which serves as switching elements, the plurality of transistors may be connected to each other in parallel, in series, or in combination of parallel connection and serial connection.

Although the switching element 1141 controls the supply of the high power supply potential VDD to each of the memory cells 1142 included in the memory cell group 1143 in FIG. 18B, the switching element 1141 may control the supply of the low power supply potential VSS.

In FIG. 18C, an example of a memory device in which each of the memory cells 1142 included in the memory cell group 1143 is supplied with the low power supply potential VSS via the switching element 1141 is illustrated. The supply of the low power supply potential VSS to each of the memory cells 1142 included in the memory cell group 1143 can be controlled by the switching element 1141.

When a switching element is provided between a memory cell group and a node to which the high power supply potential VDD or the low power supply potential VSS is supplied, data can be held even in the case where an operation of a CPU is temporarily stopped and the supply of the power supply voltage is stopped; accordingly, power consumption can be reduced. Specifically, for example, while a user of a personal computer does not input data to an input device such as a keyboard, the operation of the CPU can be stopped, so that the power consumption can be reduced.

Although the CPU is given as an example, the transistor can also be applied to an LSI such as a digital signal processor (DSP), a custom LSI, or a field programmable gate array (FPGA).

<Installation Example>

Figure 19A:
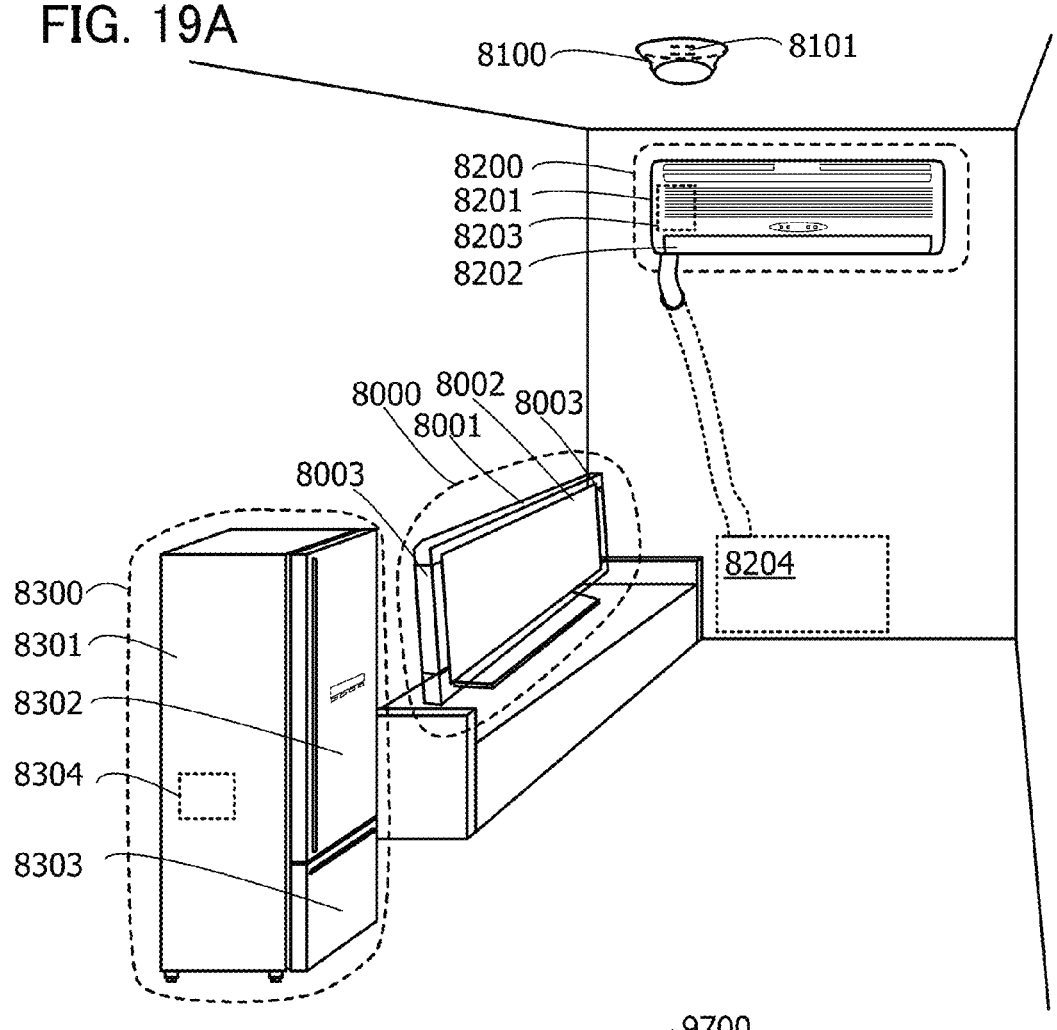
FIGS. 19A to 19C illustrate installation examples of a semiconductor device of one embodiment of the present invention.

In a television set 8000 in FIG. 19A, a display portion 8002 is incorporated in a housing 8001. The display portion 8002 displays an image and a speaker portion 8003 can output sound.

The television set 8000 may be provided with a receiver, a modem, and the like. With the receiver, the television set 8000 can receive general television broadcasting. Furthermore, when the television device set is connected to a communication network by wired or wireless connection via the modem, one-way (from a transmitter to a receiver) or two-way (between a transmitter and a receiver, between receivers, or the like) data communication can be performed.

In addition, the television set 8000 may include a CPU for performing information communication or a memory. The above display device, memory, or CPU can be used for the television set 8000.

In FIG. 19A, an alarm device 8100 is a residential fire alarm which includes a sensor portion and a microcomputer 8101. Note that the microcomputer 8101 includes a CPU in which the above transistor is used.

In FIG. 19A, a CPU that uses the above-described transistor is included in an air conditioner which includes an indoor unit 8200 and an outdoor unit 8204. Specifically, the indoor unit 8200 includes a housing 8201, an air outlet 8202, a CPU 8203, and the like. Although the CPU 8203 is provided in the indoor unit 8200 in FIG. 19A, the CPU 8203 may be provided in the outdoor unit 8204. Alternatively, the CPU 8203 may be provided in both the indoor unit 8200 and the outdoor unit 8204. When the air conditioner includes the CPU in which the above transistor is used, a reduction in power consumption of the air conditioner can be achieved.

In FIG. 19A, an electric refrigerator-freezer 8300 includes the CPU in which the above transistor is used. Specifically, the electric refrigerator-freezer 8300 includes a housing 8301, a door for a refrigerator 8302, a door for a freezer 8303, a CPU 8304, and the like. In FIG. 19A, the CPU 8304 is provided in the housing 8301. When the electric refrigerator-freezer 8300 includes the CPU 8304 in which the above transistor is used, a reduction in power consumption of the electric refrigerator-freezer 8300 can be achieved.

Figure 19B:
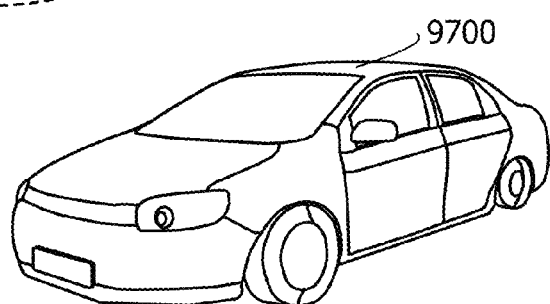
Figure 19C:
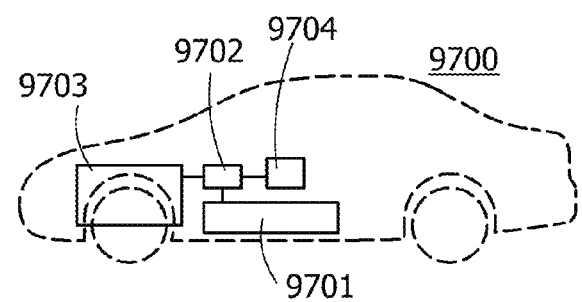

FIGS. 19B and 19C illustrate an example of an electric vehicle. An electric vehicle 9700 is equipped with a secondary battery 9701. The output of the electric power of the secondary battery 9701 is adjusted by a control circuit 9702 and the electric power is supplied to a driving device 9703. The control circuit 9702 is controlled by a processing unit 9704 including a ROM, a RAM, a CPU, or the like which is not illustrated. When the electric vehicle 9700 includes the CPU in which the above transistor is used, a reduction in power consumption of the electric vehicle 9700 can be achieved.

The driving device 9703 includes a DC motor or an AC motor either alone or in combination with an internal-combustion engine. The processing unit 9704 outputs a control signal to the control circuit 9702 based on input data such as data of operation (e.g., acceleration, deceleration, or stop) by a driver or data during driving (e.g., data on an upgrade or a downgrade, or data on a load on a driving wheel) of the electric vehicle 9700. The control circuit 9702 adjusts the electric energy supplied from the secondary battery 9701 in accordance with the control signal of the processing unit 9704 to control the output of the driving device 9703. In the case where the AC motor is mounted, although not illustrated, an inverter which converts direct current into alternate current is also incorporated.

This embodiment shows an example of a basic principle. Thus, part or the whole of this embodiment can be freely combined with, applied to, or replaced with part or the whole of another embodiment.

This application is based on Japanese Patent Application serial no. 2013-150979 filed with Japan Patent Office on Jul. 19, 2013, the entire contents of which are hereby incorporated by reference.

What is claimed is:

1. An oxide semiconductor film comprising:
   a plurality of plate particles each having a structure in which layers including a gallium atom, a zinc atom, and an oxygen atom are provided over and under a layer including an indium atom and an oxygen atom,
   wherein the plurality of plate particles is arranged irregularly.

2. The oxide semiconductor film according to claim 1, wherein a crystal boundary in the oxide semiconductor film is not observed by using a transmission electron microscope.

3. The oxide semiconductor film according to claim 1, wherein the plurality of plate particles each has a thickness of greater than or equal to 0.5 nm and less than or equal to 0.9 nm and an equivalent circle diameter of a plane of greater than or equal to 1 nm and less than or equal to 3 nm.

4. The oxide semiconductor film according to claim 1, wherein the plurality of plate particles each has regularity in atomic arrangement.

5. The oxide semiconductor film according to claim 1, wherein a plurality of circumferentially distributed spots is observed in a nanobeam electron diffraction pattern of the oxide semiconductor film.

6. The oxide semiconductor film according to claim 5, wherein a probe diameter of an electron beam is larger than or equal to 1 nm and smaller than or equal to 30 nm.

7. An semiconductor device comprising:
   a gate electrode;
   an oxide semiconductor film;
   a gate insulating layer between the gate electrode and the oxide semiconductor film; and
   a source electrode and a drain electrode each electrically connected to the oxide semiconductor film,
   wherein the oxide semiconductor film comprises a plurality of plate particles each having a structure in which layers including a gallium atom, a zinc atom, and an oxygen atom are provided over and under a layer including an indium atom and an oxygen atom, and
   wherein the plurality of plate particles is arranged irregularly.

8. The semiconductor device according to claim 7, wherein a crystal boundary in the oxide semiconductor film is not observed by using a transmission electron microscope.

9. The semiconductor device according to claim 7, wherein the plurality of plate particles each has a thickness of greater than or equal to 0.5 nm and less than or equal to 0.9 nm and an equivalent circle diameter of a plane of greater than or equal to 1 nm and less than or equal to 3 nm.

10. The semiconductor device according to claim 7, wherein the plurality of plate particles each has regularity in atomic arrangement.

11. The semiconductor device according to claim 7, wherein a plurality of circumferentially distributed spots is observed in a nanobeam electron diffraction pattern of the oxide semiconductor film.

12. The semiconductor device according to claim 11, wherein a probe diameter of an electron beam is larger than or equal to 1 nm and smaller than or equal to 30 nm.

13. A method for forming an oxide semiconductor film, comprising steps of:
   separating a plurality of plate particles from a target including indium, gallium, and zinc, wherein the plurality of plate particles each has a structure in which layers including a gallium atom, a zinc atom, and an oxygen atom are provided over and under a layer including an indium atom and an oxygen atom; and
   depositing the plurality of plate particles over a substrate irregularly.

14. The method for forming an oxide semiconductor film according to claim 13, wherein a temperature of the substrate is higher than or equal to 15° C. and lower than or equal to 35° C.

15. The method for forming an oxide semiconductor film according to claim 13, wherein the target including indium, gallium, and zinc has a composition formula of $InGaZnO_4$.

16. The method for forming an oxide semiconductor film according to claim 13, wherein the separation of the plurality of plate particles occurs by collision of an ion with the target.

17. The oxide semiconductor film according to claim 1, wherein a halo pattern is observed in a selected-area electron diffraction pattern of the oxide semiconductor film.

18. The semiconductor device according to claim 7, wherein a halo pattern is observed in a selected-area electron diffraction pattern of the oxide semiconductor film.

19. The method for forming an oxide semiconductor film according to claim 13, wherein a halo pattern is observed in a selected-area electron diffraction pattern of the oxide semiconductor film.

* * * * *